United States Patent
Odagawa et al.

(10) Patent No.: US 8,836,060 B2
(45) Date of Patent: Sep. 16, 2014

(54) SPIN DEVICE, DRIVING METHOD OF THE SAME, AND PRODUCTION METHOD OF THE SAME

(71) Applicant: Panasonic Corporation, Osaka (JP)

(72) Inventors: Akihiro Odagawa, Osaka (JP); Nozomu Matsukawa, Nara (JP)

(73) Assignee: Panasonic Corporation, Osaka (JP)

( * ) Notice: Subject to any disclaimer, the term of this patent is extended or adjusted under 35 U.S.C. 154(b) by 60 days.

(21) Appl. No.: 13/780,524

(22) Filed: Feb. 28, 2013

(65) Prior Publication Data

US 2013/0170290 A1 Jul. 4, 2013

Related U.S. Application Data

(63) Continuation of application No. PCT/JP2012/004612, filed on Jul. 19, 2012.

(30) Foreign Application Priority Data

Jul. 22, 2011 (JP) .................. 2011-160580

(51) Int. Cl.
| | |
|---|---|
| *H01L 29/82* | (2006.01) |
| *G11C 11/16* | (2006.01) |
| *H01L 49/02* | (2006.01) |
| *H01L 43/08* | (2006.01) |
| *H01L 29/66* | (2006.01) |
| *H01L 43/10* | (2006.01) |
| *H01L 29/16* | (2006.01) |

(52) U.S. Cl.
CPC ............. *G11C 11/161* (2013.01); *H01L 28/22* (2013.01); *H01L 43/08* (2013.01); *H01L 29/66984* (2013.01); *H01L 43/10* (2013.01); *H01L 29/1606* (2013.01)
USPC .... 257/421; 257/422; 257/427; 257/E29.323; 438/3; 365/171; 365/172; 365/173; 365/157; 365/158; 360/324.2; 360/326

(58) Field of Classification Search
USPC ........ 257/20, 414, 421–427, E29.323; 438/3; 365/157–158, 171–173; 360/324–326, 360/313
See application file for complete search history.

(56) References Cited

U.S. PATENT DOCUMENTS

| 8,378,329 B2* | 2/2013 | Zaliznyak et al. ................ 257/2 |
| 2010/0225312 A1* | 9/2010 | Nakamura et al. ............ 324/300 |

FOREIGN PATENT DOCUMENTS

| JP | 2009-182173 A | 8/2009 |
| JP | 2010-205975 A | 9/2010 |
| JP | 2011-124328 A | 6/2011 |

OTHER PUBLICATIONS

International Search Report issued in International Patent Application No. PCT/JP2012/004612 mailed on Oct. 16, 2012.

(Continued)

*Primary Examiner* — Jami M Valentine
(74) *Attorney, Agent, or Firm* — McDermott Will & Emery LLP

(57) ABSTRACT

The present disclosure provides a spin device including: a graphene; a first ferromagnetic electrode and a second electrode that are in electrical contact with and sandwich the graphene; a third ferromagnetic electrode and a fourth electrode that sandwich the graphene at a position apart from the first and second electrodes in electrical contact with the graphene; a current applying portion that applies an electric current between the first ferromagnetic electrode and the second electrode; and a voltage-signal detecting portion that detects spin accumulation information as a voltage signal via the third ferromagnetic electrode and the fourth electrode. The spin accumulation information is generated, by application of the electric current, in a part of the graphene that is sandwiched between the third and fourth electrodes. The first and third ferromagnetic electrodes are disposed on the same surface of the graphene, and the second and fourth electrodes are non-magnetic or ferromagnetic electrodes.

16 Claims, 23 Drawing Sheets

(56) References Cited

OTHER PUBLICATIONS

Slonczewski J.C. et al. "Theory of voltage-driven current and torque in magnetic tunnel junctions." Journal of Magnetism and Magnetic Materials. vol. 310. pp. 169-175. 2007.

Shiraishi, Masashi et al. "Robustness of Spin Polarization in Graphene-Based Spin Valves." Advanced Functional Materials. vol. 19. pp. 3711-3716. 2009.

Novoseloy, K.S. et al. "Electric Field Effect in Atomically Thin Carbon Films." Science. vol. 306. pp. 666-669. 2004.

\* cited by examiner

US 8,836,060 B2

SPIN DEVICE, DRIVING METHOD OF THE SAME, AND PRODUCTION METHOD OF THE SAME

This is a continuation of International Application No. PCT/JP2012/004612, with an international filing date of Jul. 19, 2012, which claims the foreign priority of Japanese Patent Application No. 2011-160580, filed on Jul. 22, 2011, the entire contents of both of which are hereby incorporated by reference.

BACKGROUND OF THE INVENTION

1. Field of the Invention

The present disclosure relates to a spin device that functions by transfer of spins to a graphene. The present disclosure also relates to a driving method and a production method of the spin device.

2. Description of Related Art

Substances made of carbon (C) take a wide variety of forms including, as well as diamonds, sheets, nanotubes, horns, and balls such as $C_{60}$ fullerene. Furthermore, the physical properties of such substances are more various than their forms. The rich variety of physical properties prompts energetic research and development for application of the substances. Carbon thin films are one of the substances made of carbon. Among them, a carbon thin film composed of one or several carbon atom layers in which carbon atoms are $sp^2$-bonded is called graphene. Graphene is a substance the isolation of which was realized in 2004, and its singular physical properties as two-dimensional semimetal have been discovered one after another (Science, vol. 306, pp. 666-669 (2004)).

Graphene has a singular band structure in which two π bands having linear band dispersion intersect at the Fermi energy. For this reason, it is expected that the carrier (electrons and holes) mobility in graphene should be ten times or more the carrier mobility in silicon (Si). There is a possibility that a high-speed and low-consumption electronic device can be realized by use of graphene. In addition, graphene has an effect based on its shape with respect to the electrical conductivity. JP2009-182173A discloses that if the width of graphene in a direction perpendicular to a travel direction of carriers is reduced to several nanometers to several tens of nanometers, one-dimensional quantum confinement effect is created in a section of the graphene having such a width as indicated above, and that the graphene in this section can be used, due to the effect, as a semiconductor having an energy gap in a range of about sub-eV to several eV.

Graphene is also expected to be utilized for spin devices. This is because, in spin devices which use the spins of electrons as carriers, it is desired that spin scattering in a medium (channel) through which spins are transferred (spin current flows) should be small. Spin orbit interaction, which is a major factor of spin scattering, is dependent on the value of atomic number. Spin scattering occurring in graphene is extremely small compared with that occurring in other materials such as Si and gallium arsenide. An example of spin devices that use graphene is disclosed in Advanced Functional Materials, vol. 19, pp. 3711-3716 (2009).

SUMMARY OF THE INVENTION

One non-limiting and exemplary embodiment provides a spin device that uses graphene, that has higher spin-current transfer efficiency and spin-current detection sensitivity than conventional devices, and that can have a high density.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature; a spin device including: a graphene; a first ferromagnetic electrode and a second electrode that are disposed in electrical contact with the graphene in such a manner as to sandwich the graphene; a third ferromagnetic electrode and a fourth electrode that are disposed apart from the first ferromagnetic electrode and the second electrode and in electrical contact with the graphene, in such a manner as to sandwich the graphene; a current applying portion that applies an electric current between the first ferromagnetic electrode and the second electrode which sandwich the graphene; and a voltage-signal detecting portion that detects spin accumulation information as a voltage signal via the third ferromagnetic electrode and the fourth electrode, the spin accumulation information being generated, by application of the electric current, in a part of the graphene that is sandwiched between the third ferromagnetic electrode and the fourth electrode. The first ferromagnetic electrode and the third ferromagnetic electrode are disposed on the same surface of the graphene, and the second electrode and the fourth electrode are non-magnetic electrodes or ferromagnetic electrodes.

According to the present disclosure, a spin device is obtained that uses graphene, that has higher spin-current transfer efficiency and spin-current detection sensitivity than conventional devices, and that can have a high density.

DETAILED DESCRIPTION

Figure 1:
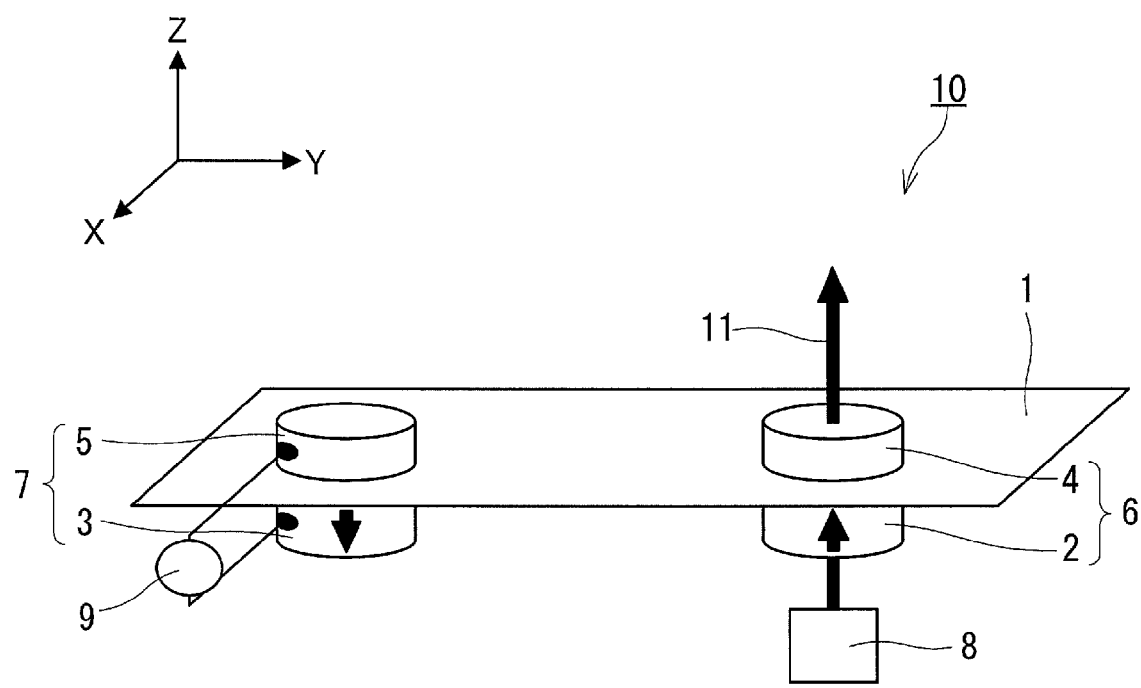
FIG. 1 is a perspective view schematically showing an example of a spin device of the present disclosure.

A first embodiment of the present disclosure provides a spin device including: a graphene; a first ferromagnetic electrode and a second electrode that are disposed in electrical contact with the graphene in such a manner as to sandwich the graphene; a third ferromagnetic electrode and a fourth electrode that are disposed apart from the first ferromagnetic electrode and the second electrode and in electrical contact with the graphene, in such a manner as to sandwich the graphene; a current applying portion that applies an electric current between the first ferromagnetic electrode and the second electrode which sandwich the graphene; and a voltage-signal detecting portion that detects spin accumulation information as a voltage signal via the third ferromagnetic electrode and the fourth electrode, the spin accumulation information being generated, by application of the electric current, in a part of the graphene that is sandwiched between the third ferromagnetic electrode and the fourth electrode. The first ferromagnetic electrode and the third ferromagnetic electrode are disposed on the same surface of the graphene, and the second electrode and the fourth electrode are non-magnetic electrodes or ferromagnetic electrodes.

A second embodiment provides the spin device according to the first embodiment, in which the second electrode and the fourth electrode are non-magnetic electrodes.

A third embodiment provides the spin device according to the first or second embodiment, in which the graphene has a net shape as seen in a direction perpendicular to a principal plane of the graphene, the first ferromagnetic electrode and the second electrode are disposed at a lattice point of the net shape, and the third ferromagnetic electrode and the fourth electrode are disposed at each of two or more other lattice points present within a range of spin accumulation generated by application of the electric current between the first ferromagnetic electrode and the second electrode.

A fourth embodiment provides the spin device according to any one of the first to third embodiments, having a structure including a stack of two or more graphenes on each of which the first ferromagnetic electrode, the second electrode, the third ferromagnetic electrode, and the fourth electrode are disposed. In the fourth embodiment, the current applying portion includes a circuit that applies the electric current collectively to two or more pairs of the first ferromagnetic electrode and the second electrode, and the pairs are disposed on the different graphenes of the stack.

A fifth embodiment provides the spin device according to any one of the first to fourth embodiments, having a structure including a stack of two or more graphenes on each of which the first ferromagnetic electrode, the second electrode, the third ferromagnetic electrode, and the fourth electrode are disposed. In the fifth embodiment, the voltage-signal detecting portion includes a circuit that collectively detects, via two or more pairs of the third ferromagnetic electrode and the fourth electrode, the spin accumulation information generated in parts of the graphenes. Each of the parts is sandwiched by one of the pairs, and the pairs are disposed on the different graphenes of the stack.

A sixth embodiment provides the spin device according to any one of the first to fifth embodiments, in which the first ferromagnetic electrode has a tunnel insulating layer and a ferromagnetic layer, and the tunnel insulating layer is in contact with the graphene.

A seventh embodiment provides the spin device according to any one of the first to fifth embodiments, in which the first ferromagnetic electrode has a giant magnetoresistive (GMR) structure.

An eighth embodiment provides the spin device according to any one of the first to fifth embodiments, in which the first ferromagnetic electrode has a tunnel magnetoresistive (TMR) structure.

A ninth embodiment provides a driving method of the spin device provided by any one of the first to eighth embodiments, the method including: applying an electric current between the first ferromagnetic electrode and the second electrode which sandwich the graphene by the current applying portion; and detecting spin accumulation information as a voltage signal via the third ferromagnetic electrode and the fourth electrode by the voltage-signal detecting portion, the spin accumulation information being generated, by application of the electric current, in a part of the graphene that is sandwiched between the third ferromagnetic electrode and the fourth electrode.

A tenth embodiment provides the driving method according to the ninth embodiment, in which two or more pairs of the third ferromagnetic electrode and the fourth electrode are disposed on the graphene, and the voltage-signal detecting portion sequentially or collectively detects the spin accumulation information generated, by application of the electric current, in parts of the graphene that are sandwiched by the two or more pairs.

An eleventh embodiment provides the driving method according to the ninth or tenth embodiment, in which two or more pairs of the third ferromagnetic electrode and the fourth electrode are disposed on the graphene, and the voltage-signal detecting portion detects, as the voltage signal, the spin accumulation information, generated by application of the electric current, in a part of the graphene that is sandwiched by at least one of the pairs. The method further includes switching subsequent signal processes in accordance with the detected voltage signal.

A twelfth embodiment provides a driving method of the spin device according to any one of the first to eighth embodiments, in which the first ferromagnetic electrode has a giant magnetoresistive (GMR) structure or a tunnel magnetoresistive (TMR) structure, and two or more pairs of the third ferromagnetic electrode and the fourth electrode are disposed on the graphene. The method includes: reading out a magnetization state of the first ferromagnetic electrode by magnetoresistance effect based on the GMR structure or the TMR structure; maintaining the magnetization state of the first ferromagnetic electrode, or changing the magnetization state of the first ferromagnetic electrode by applying a switching current between the first ferromagnetic electrode and the second electrode, depending on the read magnetization state of the first ferromagnetic electrode; applying an electric current between the first ferromagnetic electrode and the second electrode which sandwich the graphene, by using the current applying portion; and sequentially or collectively detecting spin accumulation information generated by application of the electric current in parts of the graphene that are sandwiched by the two or more pairs, by using the voltage-signal detecting portion.

A thirteenth embodiment provides a production method of the spin device provided by any one of the first to eighth embodiments, the method including: disposing the graphene on the first ferromagnetic electrode and the third ferromagnetic electrode which are spaced apart from each other, in such a manner that the graphene is in electrical contact with both of the ferromagnetic electrodes; and forming, on the disposed graphene, the second electrode and the fourth electrode which are in electrical contact with the graphene, in such a manner that the second electrode and the first ferromagnetic electrode sandwich the graphene, and that the fourth electrode and the third ferromagnetic electrode sandwich the graphene.

A fourteenth embodiment provides the production method according to the thirteenth embodiment, in which: the second electrode and the fourth electrode are ferromagnetic electrodes; a ferromagnetic material layer is formed in advance on one surface of the graphene disposed on the first ferromagnetic electrode and the third ferromagnetic electrode, the one surface being opposite to the other surface facing the first ferromagnetic electrode and the third ferromagnetic electrode; and formation of the second electrode and the fourth electrode is performed by microprocessing of the ferromagnetic material layer.

A fifteenth embodiment provides a production method of the spin device provided by any one of the first to eighth embodiments, the method including: disposing the graphene on the second electrode and the fourth electrode which are spaced apart from each other, in such a manner that the graphene is in electrical contact with both of the electrodes; and forming, on the disposed graphene, the first ferromagnetic electrode and the third ferromagnetic electrode which are in electrical contact with the graphene, in such a manner that the first ferromagnetic electrode the second electrode sandwich the graphene, and that the third ferromagnetic electrode and the fourth electrode sandwich the graphene.

A sixteenth embodiment provides the production method according to the fifteenth embodiment, in which: a ferromagnetic material layer is formed in advance on one surface of the graphene disposed on the second electrode and the fourth electrode, the one surface being opposite to the other surface facing the second electrode and the fourth electrode; and formation of the first ferromagnetic electrode and the third ferromagnetic electrode is performed by microprocessing of the ferromagnetic material layer.

Hereinafter, specific embodiments will be described. The scope of the invention is not limited by the specific embodiments described below.

Contact of an electrode (ferromagnetic electrode) made of a ferromagnetic material with graphene and application of an electric current to the graphene via the ferromagnetic electrode allow spin accumulation to be generated in the graphene. The number of spins contained in the ferromagnetic material varies depending on the directions (up or down) of the spins. That is, the ferromagnetic material is spin polarized. If an electric current is applied to graphene by using such a ferromagnetic material as an electrode, spins that reflect the imbalance of the spin directions in the ferromagnetic material (hereinafter, simply referred to as "spins") are injected into the graphene, and the flow of the spins (spin current) diffuses in the plane of the graphene. Accumulation of the spins in the graphene generated by the diffusion of the spin current is referred to as "spin accumulation". The degree to which spins are accumulated is high in a part from which the spins are injected into the graphene, and decreases with distance from the part. That is, spin concentration is high in the part, and the spin concentration decreases with distance from the part. The spin current is also the flow of spins driven by the gradient of the concentration of accumulated spins. By detecting information on such spin accumulation (spin accumulation information) in graphene, a spin device that uses spins as transfer carriers is realized. In addition, spin scattering occurring in graphene is extremely small, and the spin relaxation length in graphene is on the order of several microns, which is long. Therefore, the use of graphene as a transfer medium of spins achieves widespread spin accumulation, and is also expected to allow realization of a spin device that has a high transfer efficiency and is capable of operating at room temperature. By contrast, the spin relaxation length in materials such as Si and gallium arsenide, which are used for conventional electronic devices, is short because of large spin orbit interaction of the materials. For this reason, even if a spin device is built using these materials, the transfer efficiency of spins is low, and only operation at low temperature can be expected. Firstly, a spin device that uses graphene is advantageous in this respect.

Furthermore, a spin current is a flow of spins which represents an angular momentum, and therefore is a quantity including a second-order time-derivative term. Accordingly, no energy dissipation takes place in principle. For this reason, an active device using only the spin current that is accompanied by no electric current (pure spin current) as a transfer carrier can be expected to operate with a significantly low power consumption.

Figure 22:
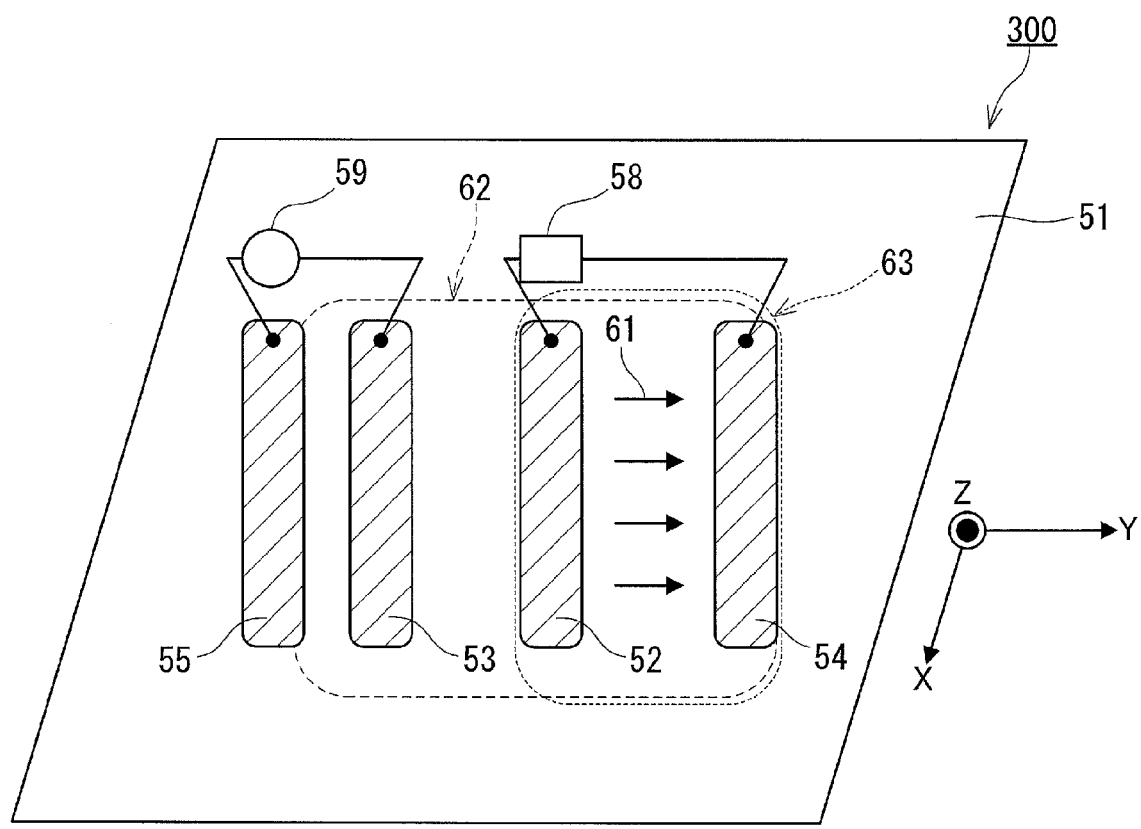
FIG. 22 is a plan view schematically showing an example of conventional spin devices, and the operation thereof.

FIG. 22 shows the configuration of a graphene-using spin device that is disclosed in Advanced Functional Materials, vol. 19, pp. 3711-3716 (2009), and also shows a state of spin accumulation in this device. The spin device 300 shown in FIG. 22 includes a graphene 51, a ferromagnetic electrode 52, a ferromagnetic electrode 53, a non-magnetic electrode 54, and a non-magnetic electrode 55. The electrodes 52 to 55 are all rectangular, and are disposed on the same surface of the graphene 51 in such a manner that the directions of their long sides are parallel to each other. An electric current source 58 is connected as a part of a current applying portion to the ferromagnetic electrode 52 and the non-magnetic electrode 54. A voltage detector 59 is connected as a part of a voltage detecting portion to the ferromagnetic electrode 53 and the non-magnetic electrode 55. In FIG. 22, the plane (principal plane) of the graphene 51 lies in the X-Y plane. The direction perpendicular to the sheet of paper is the Z-axis direction.

Such configuration in which two ferromagnetic electrodes and two non-magnetic electrodes are disposed on the same surface as described above is employed also in conventional spin devices that use Si or gallium arsenide.

The operation of the spin device 300 will be described. An electric current 61 is applied between the ferromagnetic electrode 52 and the non-magnetic electrode 54 using the electric current source 58. The electric current 61 flows in the plane of the graphene 51 between the ferromagnetic electrode 52 and the non-magnetic electrode 54. Spins injected into the graphene 51 from a joint portion between the graphene 51 and the ferromagnetic electrode 52 (spins that reflect the polarization of the ferromagnetic material of which the ferromagnetic electrode 52 is made) diffuse in the plane of the graphene 51 from the joint portion, thereby generating spin accumulation in a spin accumulation region 62. From another standpoint, a spin current flows in the spin accumulation region 62 of the graphene 51 by application of the electric current 61 into the plane of the graphene 51.

As a result of the application of the electric current 61, not only the spin current but also an electric current flows in a region of the graphene 51 in the vicinity of the ferromagnetic electrode 52 and the non-magnetic electrode 54 (an electric current distribution region 63) including a part located between the ferromagnetic electrode 52 and the non-magnetic electrode 54. The spin accumulation region 62 and the electric current distribution region 63 overlap each other to a large extent. The electric current flowing in the plane of the graphene 51 hinders detection of only the spin current flowing in the electric current distribution region 63 (detection of spin accumulation information in the electric current distribution region 63). This is because it is difficult to separate the spin current from various electromagnetic effects generated by the electric current.

In the spin device 300, a spin detecting portion for detecting a spin current (detecting spin accumulation information) is provided in the spin accumulation region 62 excluding the electric current distribution region 63. The spin detecting portion is composed of the ferromagnetic electrode 53 and the non-magnetic electrode 55. A spin current in the vicinity of the ferromagnetic electrode 53 in the graphene 51 is detected by the voltage detector 59 as a voltage signal between the ferromagnetic electrode 53 and the non-magnetic electrode 55, the voltage signal corresponding to the magnetization state of the ferromagnetic electrode 53 which reflects the spin current. The voltage signal is also a signal representing a magnetoresistance change occurring between the spin current (spin accumulation) and the spins in the ferromagnetic electrode 53. Such a method, in which a generated spin current is detected in a region separated from a region into which spins are injected by application of an electric current, is called a non-local detection method.

In the spin device 300, however, since the electric current 61 is applied in an in-plane direction of the graphene 51 for spin injection, high-sensitivity detection of a spin current is difficult.

Figure 23A:
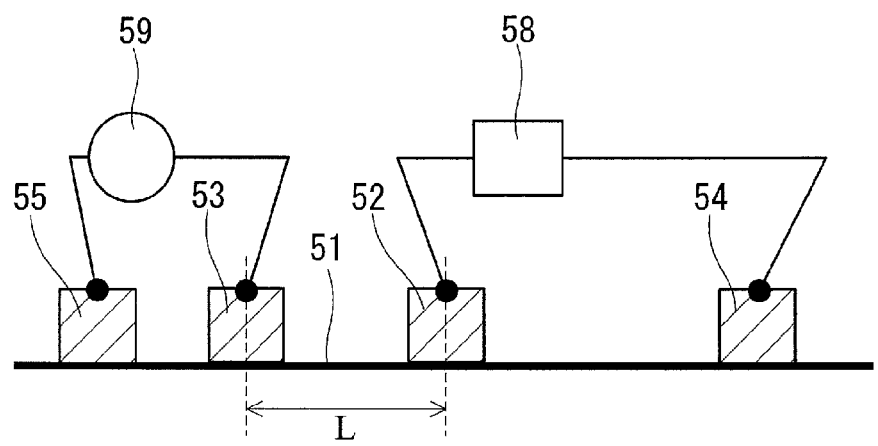
FIG. 23A is a diagram schematically showing a cross-section of the conventional spin device shown in FIG. 22.
Figure 23B:
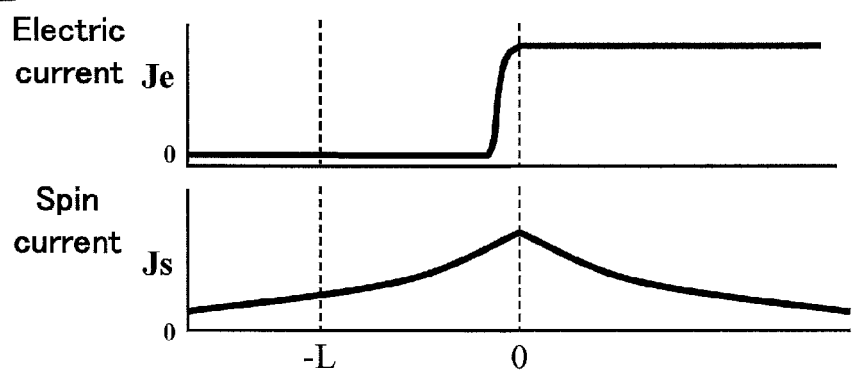
FIG. 23B is a schematic diagram showing the distribution of electric current and the distribution of spin current in the cross-section shown in FIG. 23A.

FIG. 23A shows a cross-section of the spin device 300 in the Y-Z plane. FIG. 23B schematically shows the distribution of electric current (Je) and the distribution of spin current (Js) in the cross-section. In the spin device 300, the electric current is distributed widely between the ferromagnetic electrode 52 and the non-magnetic electrode 54 due to application of an electric current in the in-plane direction of the graphene 51. On the other hand, as shown in FIG. 23B, the distribution of spin current (the degree of spin accumulation) has a peak at the ferromagnetic electrode 52 (has a peak at a position of zero in the horizontal axis of FIG. 23B), and gradually decreases as a distance L from the electrode increases. Therefore, in order to enhance the detection sensitivity of a spin current, it is desired that the ferromagnetic electrode 53 and the non-magnetic electrode 55 which constitute the spin detecting portion should be disposed as close as possible to the ferromagnetic electrode 52. In the spin device 300, however, detection of only a spin current is not possible in the region in which the electric current 61 is flowing (the region on the right side of the ferromagnetic electrode 52 in FIG. 23A). This is because the electrochemical potential has a gradient caused by the application of the electric current 61, and because a signal such as an anisotropic magnetoresistance effect is generated by the application of the electric current to the ferromagnetic material 52. Furthermore, in the spin device 300, since the electric current 61 is applied in the plane of the graphene 51, the electric field resulting from the electric current 61 is leaked and distributed also to the region of the graphene 51 in which no electric current flows. For this reason, the detection may inevitably be affected by the distribution of the leaked electric field. In order to avoid such affected detection, the spin detecting portion needs to be disposed outside the region to which the electric field is leaked and distributed, i.e., in a region which is away from the ferromagnetic electrode 52 and in which the spin current is reduced (the degree of spin accumulation is low). These facts make it difficult for the spin device 300 to detect a spin current with high sensitivity.

This difficulty becomes a more serious problem as spin devices are miniaturized. This is because the distance between the ferromagnetic electrodes 52 and 53 becomes smaller with the miniaturization, thus making it difficult to physically separate the electric current application region and the spin current detection region in the graphene 51.

In addition, in the spin device 300, at least four electrodes are disposed on the same surface of the graphene 51, and therefore, an area required for the minimum unit as a spin device is large. For this reason, densification (high integration) is difficult.

An example of a spin device of the present disclosure is shown in FIG. 1. The spin device 10 shown in FIG. 1 includes a graphene 1, a first ferromagnetic electrode 2, a second electrode 4, a third ferromagnetic electrode 3, a fourth electrode 5, a current applying portion, and a voltage-signal detecting portion.

The graphene 1 may be a single-layer graphene composed of one carbon atom layer in which carbon atoms are $sp^2$-bonded, or may be a multi-layer graphene composed of a plurality of the carbon atom layers. In FIG. 1, the plane (principal plane) of the graphene 1 lies in the X-Y plane. The direction perpendicular to the principal plane is the Z-axis direction.

On the under surface of the graphene 1, the first ferromagnetic electrode 2 and the third ferromagnetic electrode 3 are disposed apart from each other. On the upper surface of the graphene 1, the second electrode 4 and the fourth electrode 5 are disposed apart from each other.

The first ferromagnetic electrode 2 and the second electrode 4 are each disposed in electrical contact with the graphene 1 in such a manner as to sandwich the graphene 1.

The first ferromagnetic electrode 2 and the second electrode 4 are connected to an electric current source 8 which is a part of the current applying portion. An electric current 11 is applied by the electric current source 8 between the first ferromagnetic electrode 2 and the second electrode 4 which sandwich the graphene 1, and thereby spins (spins reflecting the polarization of the ferromagnetic material of which the first ferromagnetic electrode 2 is made) are injected into the graphene 1. The pair of the first ferromagnetic electrode 2 and the second electrode 4 functions as a spin injection source 6 for the graphene 1.

The third ferromagnetic electrode 3 and the fourth electrode 5 are each disposed in electrical contact with the graphene 1 in such a manner as to sandwich the graphene 1. The third ferromagnetic electrode 3 and the fourth electrode 5 are connected to a voltage detector 9 which is a part of the voltage-signal detecting portion. The pair of the third ferromagnetic electrode 3 and the fourth electrode 5 is disposed apart from the spin injection source 6 which is the pair of the first ferromagnetic electrode 2 and the second electrode 4. The pair of the third ferromagnetic electrode 3 and the fourth electrode 5 functions as a spin detecting portion 7 for detecting a spin current in a part of the graphene 1 at which this pair is located (detecting spin accumulation information generated in the part).

In the spin device 10, the electric current 11 for spin injection is applied in the Z-axis direction (thickness direction) of the graphene 1. In the example shown in FIG. 1, the electric current flows in the direction from the first ferromagnetic electrode 2 to the second electrode 4. However, the electric current may flow in the reverse direction, i.e., in the direction from the second electrode 4 to the first ferromagnetic electrode 2. In either case, spins are injected into the graphene 1.

The spins injected into the graphene 1 from a joint portion between the graphene 1 and the first ferromagnetic electrode 2 diffuse in the plane of the graphene 1 from the joint portion, and spin accumulation is generated centering around the joint portion. From another standpoint, a spin current driven by the gradient of the spin concentration flows in the plane of the graphene 1 centering around the joint portion, as a result of the application of the electric current 11. The spin current flowing at this time is a pure spin current accompanied by no electric current since the electric current 11 flows in the Z-axis direction (the thickness direction of the graphene 1). That is, the spin device 10 allows signal transfer using a pure spin current as a transfer carrier, and is expected to be driven with a significantly low power consumption.

Figure 2A:
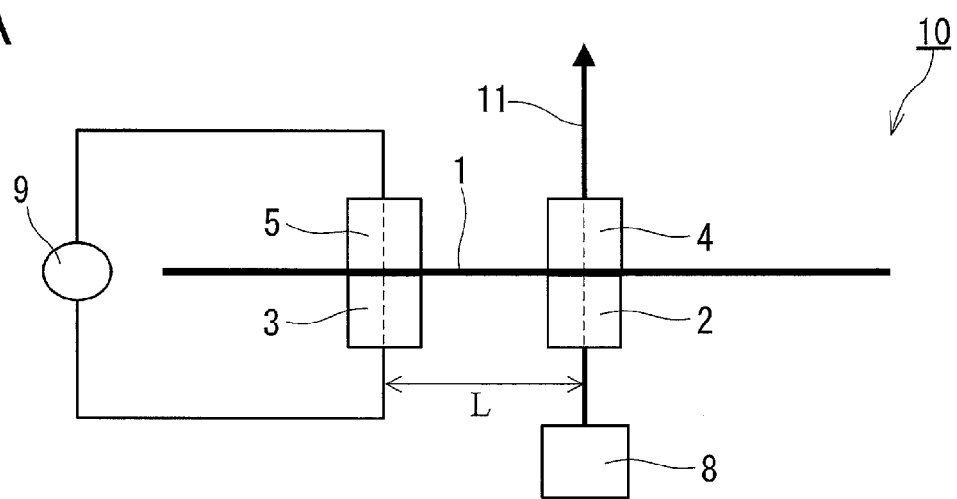
FIG. 2A is a diagram schematically showing a cross-section of the spin device shown in FIG. 1.
Figure 2B:
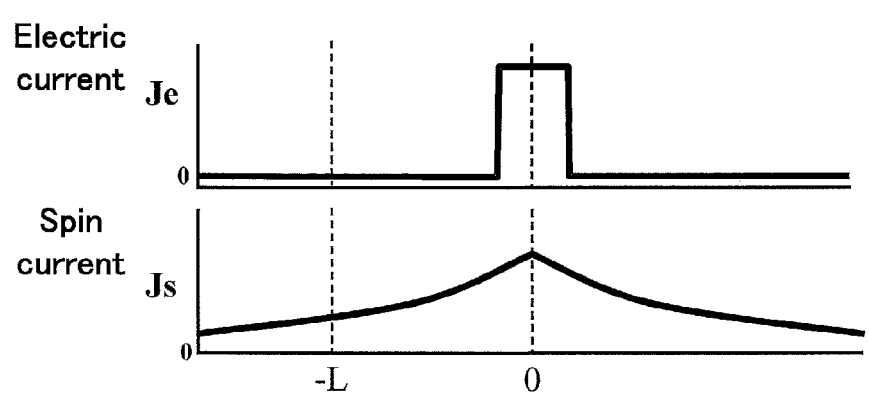
FIG. 2B is a schematic diagram showing the distribution of electric current and the distribution of spin current in the cross-section shown in FIG. 2A.
Figure 3:
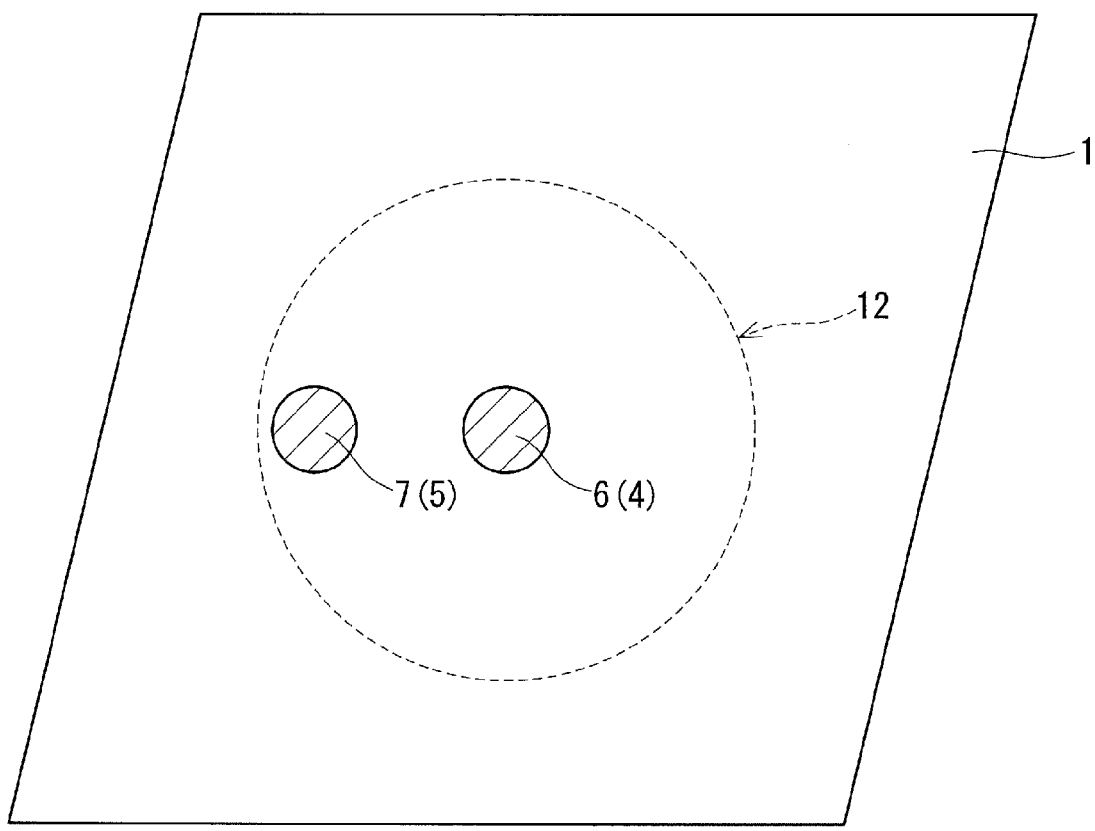
FIG. 3 is a plan view schematically showing the upper surface of the spin device shown in FIG. 1.

FIG. 2A shows a cross-section of the spin device 10 in the Y-Z plane. FIG. 2B schematically shows the distribution of electric current (Je) and the distribution of spin current (Js) in the cross-section. As shown in FIG. 2B, in the spin device 10, the pure spin current accompanied by no electric current diffuses in the graphene 1 centering around the pair of the first ferromagnetic electrode 2 and the second electrode 4. Therefore, as also shown in FIG. 3 illustrating the spin device 10 seen in the Z-axis direction, a spin current generated by the application of the electric current 11 can be detected (spin accumulation information can be detected) by the pair of the third ferromagnetic electrode 3 and the fourth electrode 5 (the spin detecting portion 7) located at any position within a spin accumulation region 12 which spreads in the plane of the graphene 1 centering around the spin injection source 6 as a result of the application of the electric current 11.

In the spin device 10, there is no required restriction on the arrangement of the spin detecting portion 7 unlike in the spin device 300 in which an electric current flows in the plane of a graphene, and high-sensitivity detection of a spin current is possible. Furthermore, in the spin device 10, since an electric current flows perpendicular to the plane of the graphene 1, the electric current application region and the pure spin current detection region in the graphene 1 can be separated, which brings great advantages in noise reduction, improvement of detection sensitivity, and miniaturization and densification of the spin device.

In addition, in the spin device 10, the electrodes constituting the spin injection source 6 and the spin detecting portion 7 are dispersedly disposed on both surfaces of the graphene 1 in such a manner as to sandwich the graphene 1. Therefore, an area required for the minimum unit as a spin device is small, and the minimum unit can also be formed in accordance with the minimum area specified in an adopted rule for miniaturization. This fact is advantageous in densification (high integration) of the device, and also advantageous in stacking (high integration) of the device as will be described later. Examples of spin devices using these advantages include non-volatile memories and switching devices that utilize the non-volatile storage ability of ferromagnetic materials and that have high density and high integration.

The information on the spin accumulation generated in the plane of the graphene 1 by the application of the electric current 11 is detected as a voltage signal by the voltage-signal detecting portion via the spin detecting portion 7 disposed in the spin accumulation region 12. The detected voltage signal is a voltage signal that corresponds to spin accumulation information generated in the spin detecting portion 7 in the graphene 1 (generated in a part sandwiched between the third ferromagnetic electrode 3 and the fourth electrode 5). Specifically, the voltage detector 9 detects a voltage between the third ferromagnetic electrode 3 and the fourth electrode 5, the voltage corresponding to the magnetization state of the third ferromagnetic electrode 3 which reflects the spin current (spin accumulation) in the plane of the graphene 1. This voltage signal is also a signal representing a magnetoresistance change occurring between the spin current and the spins in the third ferromagnetic electrode 3. The voltage signal detected via the spin detecting portion 7 varies depending on the amount of spin accumulation in a part of the graphene 1 with which the spin detecting portion 7 is in contact.

In the spin device 10, it is sufficient that each of the first ferromagnetic electrode 2, the second electrode 4, the third ferromagnetic electrode 3, and the fourth electrode 5 is disposed at least in electrical contact with the graphene 1. In the example shown in FIG. 1, all of these electrodes are disposed in contact with the surfaces of the graphene 1.

The configuration of the pair of the first ferromagnetic electrode 2 and the second electrode 4 is not limited as long as the electric current 11 can be applied in the thickness direction of the graphene 1, and spins can be injected into the graphene 1. For example, the second electrode 4 may be a non-magnetic electrode made of a non-magnetic material, or may be a ferromagnetic electrode made of a ferromagnetic material.

As shown in the example of FIG. 1 and FIG. 2A, the first ferromagnetic electrode 2 and the second electrode 4 desirably have the same shape at their portions which are in contact with the graphene 1, as seen in the direction perpendicular to the surfaces of the graphene 1, and more desirably, the first ferromagnetic electrode 2 and the second electrode 4 are disposed so that overlap between the portions is as large as possible. This configuration of the first ferromagnetic electrode 2 and the second electrode 4 suppresses leakage of part of the electric current 11 into the plane of the graphene 1. Note that since such large overlap between the spin accumulation region 62 and the electric current distribution region 63 as observed in the spin device 300 can be avoided as long as the electric current 11 is applied in the thickness direction of the graphene, part of the leakage is allowable. In other words, the shapes and arrangement of the first ferromagnetic electrode 2 and the second electrode 4 can be adjusted and selected depending on the degree of leakage which is allowable for the spin device 10.

The configuration of the pair of the third ferromagnetic electrode 3 and the fourth electrode 5 is not limited as long as a voltage signal corresponding to the spin accumulation information of the graphene 1 can be detected. For example, the fourth electrode 5 may be a non-magnetic electrode made of a non-magnetic material, or may be a ferromagnetic electrode made of a ferromagnetic material.

As shown in the example of FIG. 1 and FIG. 2A, the third ferromagnetic electrode 3 and the fourth electrode 5 desirably have the same shape at their portions which are in contact with the graphene 1, as seen in the direction perpendicular to the plane of the graphene 1, and more desirably, the third ferromagnetic electrode 3 and the fourth electrode 5 are disposed so that overlap between the portions is as large as possible. In this case, the efficiency of the spin detecting portion 7 is high.

For example, both the second electrode 4 and the fourth electrode 5 are non-magnetic electrodes. One of them may be a non-magnetic electrode, and the other may be a ferromagnetic electrode.

The configuration of the current applying portion is not limited as long as the electric current 11 can be applied between the first ferromagnetic electrode 2 and the second electrode 4. For example, the current applying portion includes the electric current source 8 and a circuit for connecting the electric current source 8 to the first ferromagnetic electrode 2 and the second electrode 4.

The configuration of the voltage-signal detecting portion is not limited as long as the above-described voltage signal can be detected via the third ferromagnetic electrode 3 and the fourth electrode 5. For example, the voltage-signal detecting portion includes the voltage detector 9 and a circuit for connecting the detector 9 to the third ferromagnetic electrode 3 and the fourth electrode 5.

In the example shown in FIG. 1, the first ferromagnetic electrode 2 and the third ferromagnetic electrode 3 are disposed on one surface of the graphene 1, while the second electrode 4 and the fourth electrode 5 are disposed on the other surface opposite to the one surface. Alternatively, the first ferromagnetic electrode 2 and the fourth electrode 5 may be disposed on one surface of the graphene 1, and the third ferromagnetic electrode 3 and the second electrode 4 may be disposed on the other surface opposite to the one surface. Also in this case, the same type of spin device can be obtained.

The spin accumulation region 12 of the spin device 10 spreads isotropically in the plane of the graphene 1, centering around the spin injection source 6. This spread is not affected by the electric current 11 for spin injection. Therefore, there is no restriction on the arrangement of the spin detecting portion 7 in the device 10. Making use of such high geometric degree of freedom, two or more spin detecting portions 7 may be arranged relative to one spin injection source 6. In this case, a spin device with further enhanced sensitivity can be built. Also, the degree of freedom in use application of the spin device is increased. For example, a magnetic sensor can be built that detects the distribution of a spatially-modulated external magnetic field as modulation of a spin current in the plane of graphene.

Figure 4:
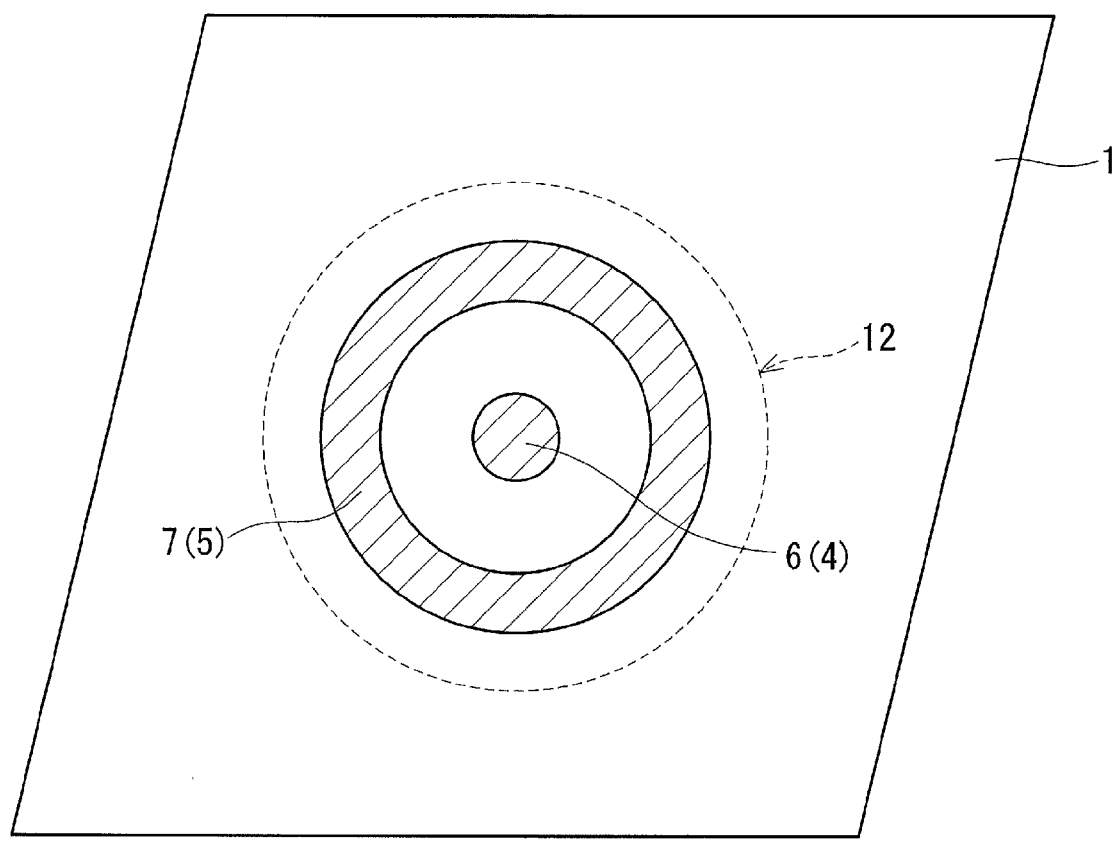
FIG. 4 is a plan view schematically showing another example of a spin device of the present disclosure.

FIG. 4 shows an example of a spin device of the present disclosure in which the spin detecting portion 7 has another shape. In the spin device shown in FIG. 4, a ring-shaped spin detecting portion 7 is provided apart from the spin injection source 6 in such a manner as to surround the spin injection source 6. The ring of the spin detecting portion 7 is disposed in the spin accumulation region 12 spreading from the spin injection source 6 at such a position that the distance from the spin injection source 6 is constant over the entire circumference of the ring. Although not shown in FIG. 4, the first ferromagnetic electrode 2 is disposed in such a manner as to face the second electrode 4 across the graphene 1, while the third ferromagnetic electrode 3 is disposed in such a manner as to face the fourth electrode 5 across the graphene 1. Employing and disposing such a spin detecting portion 7 can be realized only when electrodes are dispersedly disposed on both surfaces of graphene.

In the embodiment shown in FIG. 4, the area of electrodes for detecting the spin accumulation information in the spin accumulation region 12 is large. Therefore, the sensitivity of the spin device is further enhanced.

Figure 5:
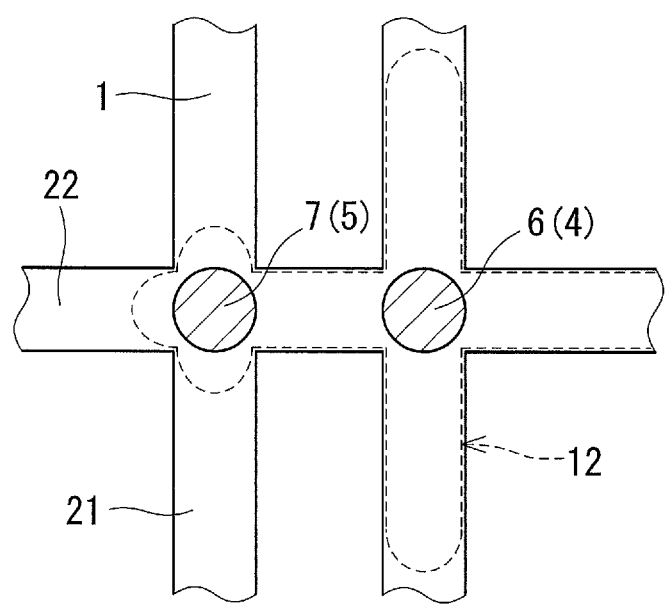
FIG. 5 is a plan view schematically showing still another example of a spin device of the present disclosure.

FIG. 5 shows an example of a spin device of the present disclosure in which the graphene 1 has another shape. In the example shown in FIG. 1, the graphene 1 has a sheet shape which extends in the X-Y plane. By contrast, in the example shown in FIG. 5, the graphene 1 has a net shape, as seen in a direction perpendicular to its principal plane. Apart of this graphene 1 can be seen in FIG. 5. In this net shape, a strip-shaped body 22 of graphene extending in a lateral (horizontal) direction in the sheet of paper of FIG. 5 intersects with a strip-shaped body 21 of graphene extending in a longitudinal (vertical) direction. In the present specification, such a shape in which a plurality of strip-shaped bodies intersect with each other is also referred to as a shape of "matrices of band". In FIG. 5, the spin injection source 6, which is composed of the first ferromagnetic electrode 2 (cannot be seen because of being disposed on the opposite surface of the graphene 1) and the second electrode 4, is disposed at a lattice point of the net shape, i.e., at an intersection between the strip-shaped body 21 and the strip-shaped body 22. The first ferromagnetic electrode 2 and the second electrode 4 sandwich the lattice point of the graphene 1. The spin detecting portion 7, which is composed of the third ferromagnetic electrode 3 (cannot be seen because of being disposed on the opposite surface of the graphene 1) and the fourth electrode 5, is disposed at another lattice point located near the above lattice point (an adjacent lattice point in the example shown in FIG. 5). The third ferromagnetic electrode 3 and the fourth electrode 5 sandwich the other lattice point of the graphene 1. The spin detecting portion 7 is located in the spin accumulation region 12 which spreads centering around the spin injection source 6 due to the application of the electric current 11 to the spin injection source 6.

The net shape of the graphene 1 is not limited. For example, in the example shown in FIG. 5, the strip-shaped body 21 and the strip-shaped body 22 are orthogonal to each other as seen in a direction perpendicular to the principal plane of the graphene 1. However, the angle at which the two strip-shaped bodies intersect with each other can freely be set to the extent that the spin device can be built. That is, the net shape is, for example, a shape in which two or more strip-shaped bodies (strip-shaped portions) extending in a certain direction intersect with two or more strip-shaped bodies extending in a direction different from the certain direction. From the standpoint of suppressing unnecessary diffusion of spins into portions other than a lattice point at which the spin detecting portion 7 is disposed and thereby preventing loss of a spin current, the width of at least one of the strip-shaped body 21 and the strip-shaped body 22 may be several nanometers or more and 100 nm or less, or may be several nanometers or more and 10 nm or less.

The graphene 1 having a net shape can be obtained by microprocessing of graphene. A material which blocks diffusion of spins (in which spin current cannot flow), such as an interlayer insulating film, may be disposed in a space between the strip-shaped body 21 and the strip-shaped body 22. Alternatively, the same type of spin device can be obtained also by employing a graphene 1 that includes an oxidized portion formed of oxidized graphene and a non-oxidized portion having a shape corresponding to the strip-shaped bodies 21 and 22, because oxidized graphene blocks diffusion of spins. The same applies to the following spin devices including a graphene 1 having a net shape.

Figure 6:
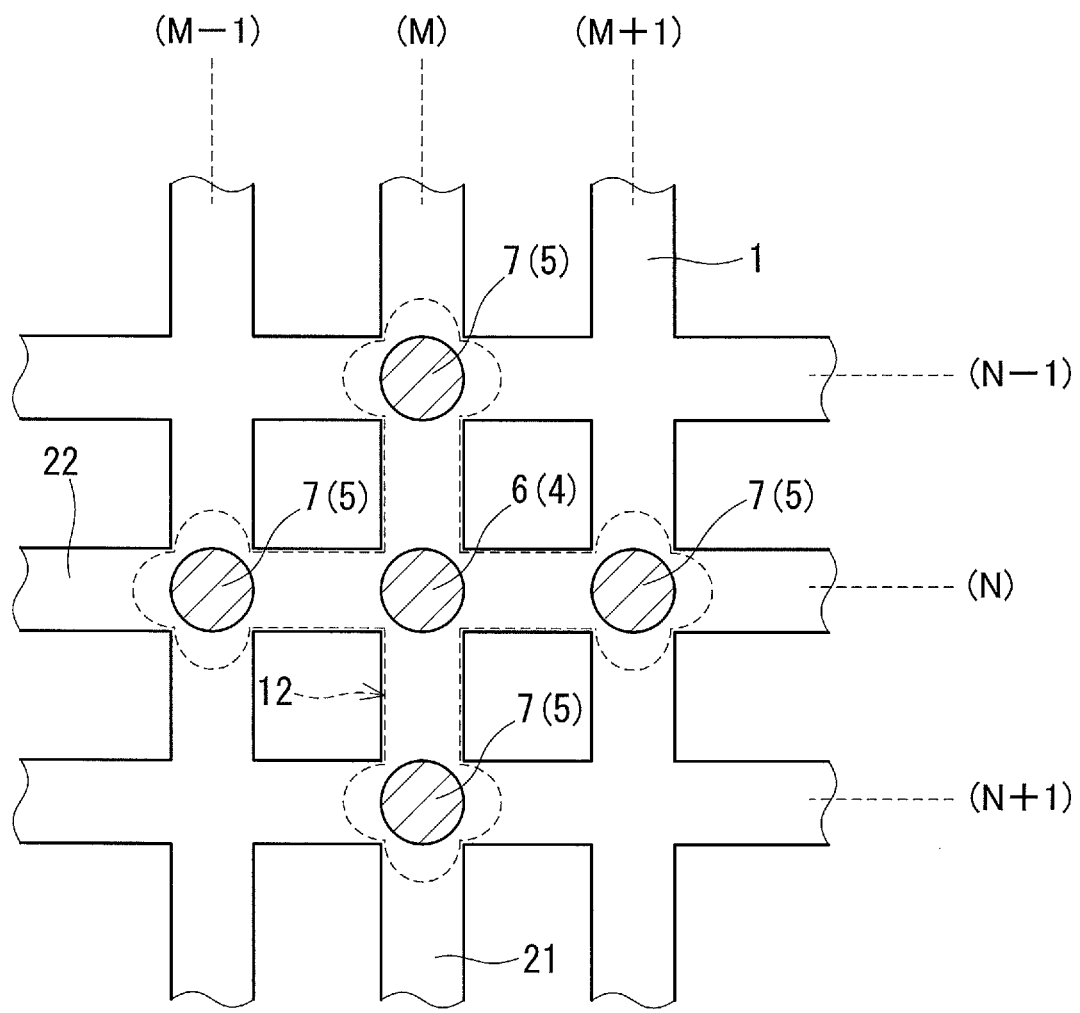
FIG. 6 is a plan view schematically showing still another example of a spin device of the present disclosure.
Figure 7:
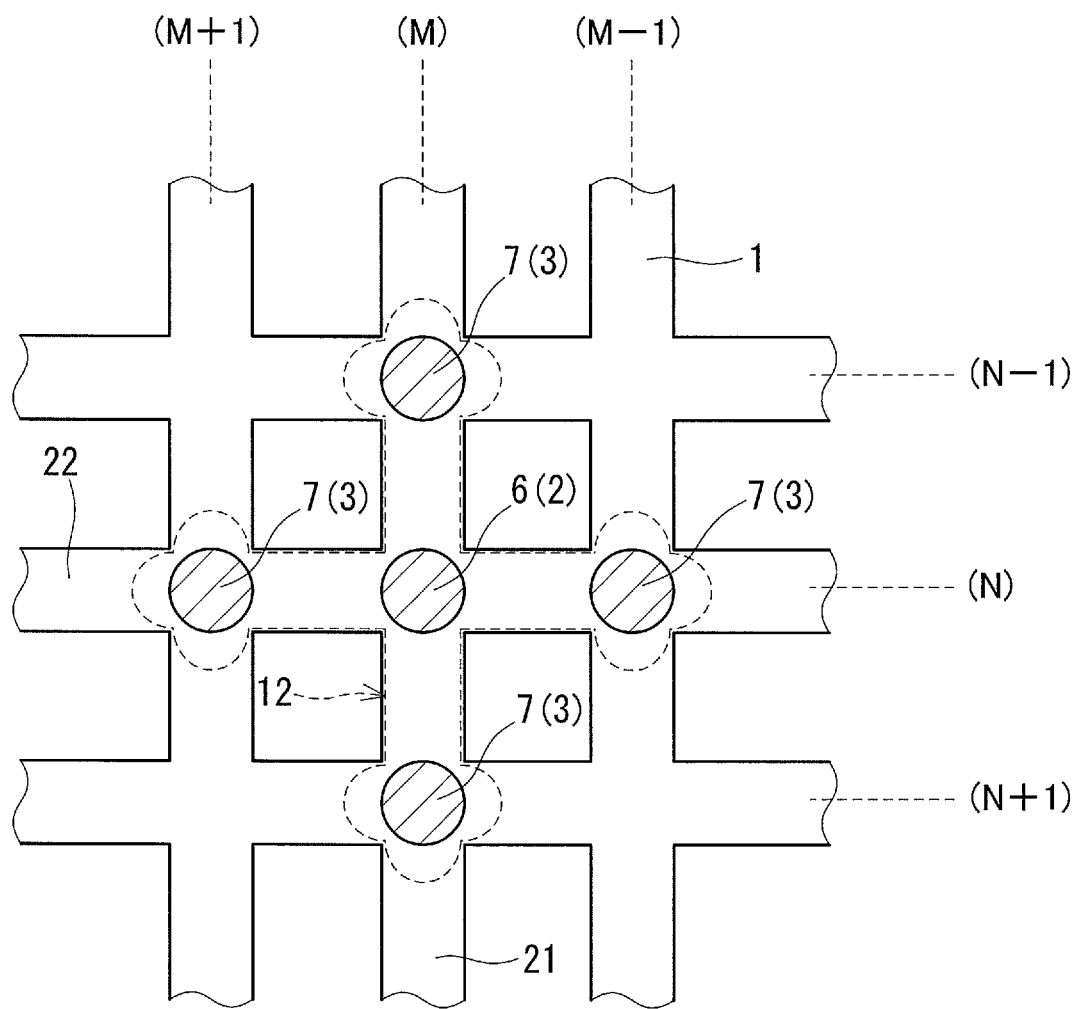
FIG. 7 is a plan view schematically showing the spin device of FIG. 6 seen from the opposite side of graphene.

Another example of a spin device of the present disclosure is shown in FIGS. 6 and 7. FIG. 6 is a schematic diagram of the spin device seen from the side on which the second electrode 4 and the fourth electrode 5 are disposed, while FIG. 7 is a schematic diagram of the spin device seen from the side on which the first ferromagnetic electrode 2 and the third ferromagnetic electrode 3 are disposed. In the example shown in FIG. 6, the graphene 1 has a net shape, as seen in a direction perpendicular to its principal plane. In this net shape, the strip-shaped bodies 21 and 22 of graphene intersect with each other similarly as in the example shown in FIG. 5. In FIG. 6, the spin injection source 6 is disposed at a lattice point of the net shape, i.e., at an intersection between the strip-shaped body 21 and the strip-shaped body 22. The spin detecting portion 7 is disposed at each of two or more lattice points located near the above lattice point (four lattice points adjacent to the above lattice point in the vertical directions and horizontal directions on the sheet of paper in the example shown in FIG. 6). Each spin detecting portion 7 is located in the spin accumulation region 12 which spreads centering around the spin injection source 6 due to the application of the electric current 11 to the spin injection source 6.

In this example, output differences corresponding to the magnetization states of the respective third ferromagnetic electrodes 3 of the spin detecting portions 7 are generated between voltage signals (spin signals) detected via the individual spin detecting portions 7. Therefore, the magnetization states of the third ferromagnetic electrodes 3 that correspond to the magnetization state of the first ferromagnetic electrode 2 in the spin injection source 6 can collectively be read in a non-destructive manner.

Figure 8:
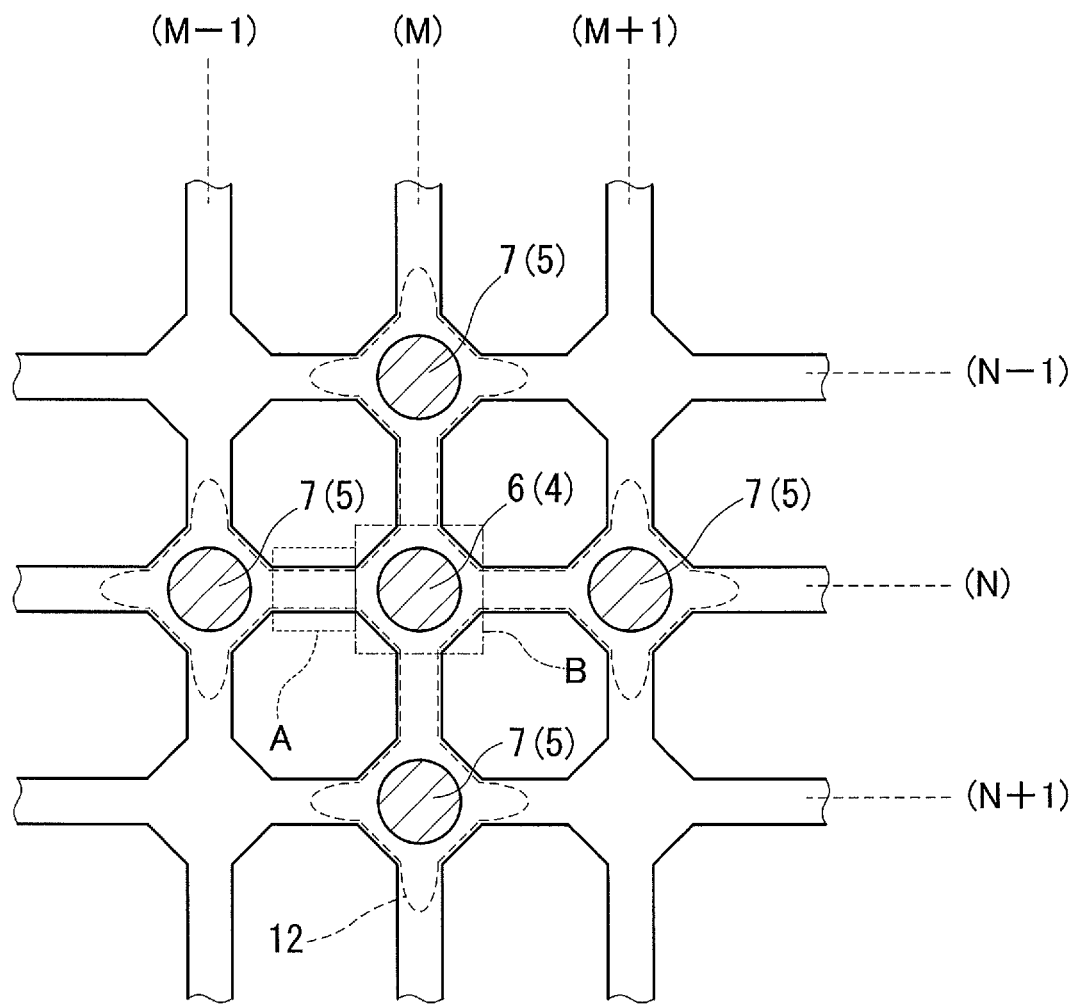
FIG. 8 is a plan view schematically showing still another example of a spin device of the present disclosure.

Another example of a spin device of the present disclosure is shown in FIG. 8. In the example shown in FIG. 8, the graphene 1 has a net shape, as seen in a direction perpendicular to its principal plane. In this net shape, two or more strip-shaped bodies 21 of graphene intersect with two or more strip-shaped bodies 22 of graphene as similarly in the example shown in FIGS. 6 and 7. In FIG. 8, the spin injection source 6 is disposed at a lattice point of the net shape, i.e., at an intersection between the strip-shaped body 21 and the strip-shaped body 22. The spin detecting portions 7 are disposed at each of two or more lattice points located near the above lattice point (four lattice points adjacent to the above lattice point in the vertical directions and horizontal directions on the sheet of paper in the example shown in FIG. 8). The spin detecting portions 7 are located in the spin accumulation region 12 which spreads centering around the spin injection source 6 due to the application of the electric current 11 to the spin injection source 6. The intersections between the strip-shaped bodies 21 and the strip-shaped bodies 22 are expanded, and the width of the graphene 1 at the intersections is larger than the width of the strip-shaped bodies 21 and 22 at other portions than the intersections.

In FIG. 8, the width of the portions B near the spin injection source 6 and the spin detecting portions 7 in the graphene 1 (the portions near the lattice points) is larger than the width of the portions A connecting the spin injection source 6 to the spin detecting portions 7. In such a shape, the width of the portions through which a spin current is propagated of the graphene 1 is relatively small. Therefore, regions which are other than the lattice points and in which a spin current generated in the spin injection source 6 diffuse are reduced, and loss of a spin signal is thus suppressed. This contributes to improvement in sensitivity of the spin device, such as allowing detection of a spin current by a spin detecting portion 7 disposed at a lattice point far from the spin injection source 6. For example, the width of the portions A may be several nanometers or more and 100 nm or less, or may be several nanometers or more and 10 nm or less.

Figure 9:
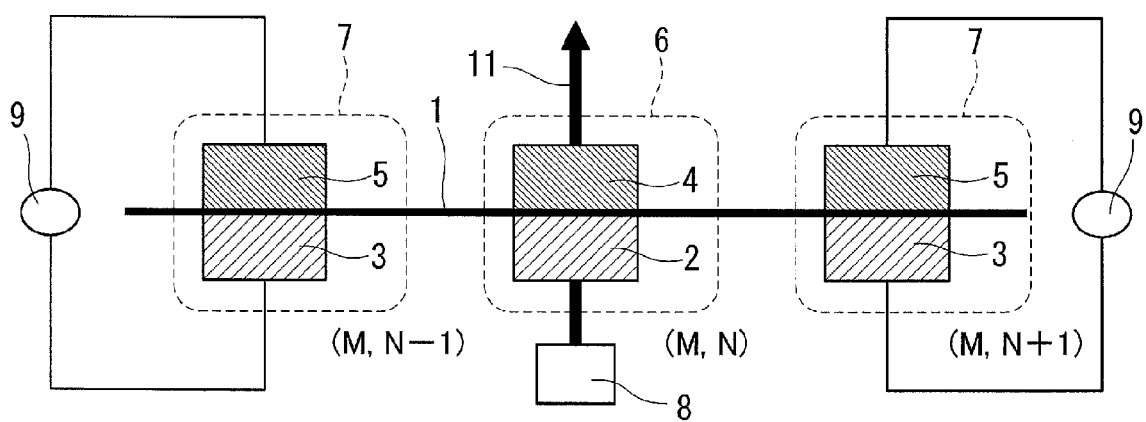
FIG. 9 is a diagram schematically showing a cross-section of the spin device shown in FIG. 6.

An example of a driving method of the spin device shown in FIG. 6 will be described with reference to FIG. 9 and FIG. 10. In the spin device shown in FIG. 6, the lattice points of the graphene 1 having a net shape can be represented by columns (M) and rows (N), i.e., can be represented in matrix such as (M, N), for example. FIG. 9 shows a cross-section of the spin device shown in FIG. 6 which is taken along a plane perpendicular to the principal plane of the graphene 1 and passing through the spin detecting portion 7 at (M, N−1), the spin injection source 6 at (M, N), and the spin detecting portion 7 at (M, N+1). The electric current source 8 is connected to the spin injection source 6 located at the address (M, N). The voltage detectors 9 are connected to the spin detecting portions 7 located at the addresses (M, N−1), and (M, N+1), respectively. Hereinafter, the spin injection source 6 and the spin detecting portions 7 may also be simply referred to as an "element".

Figure 10:
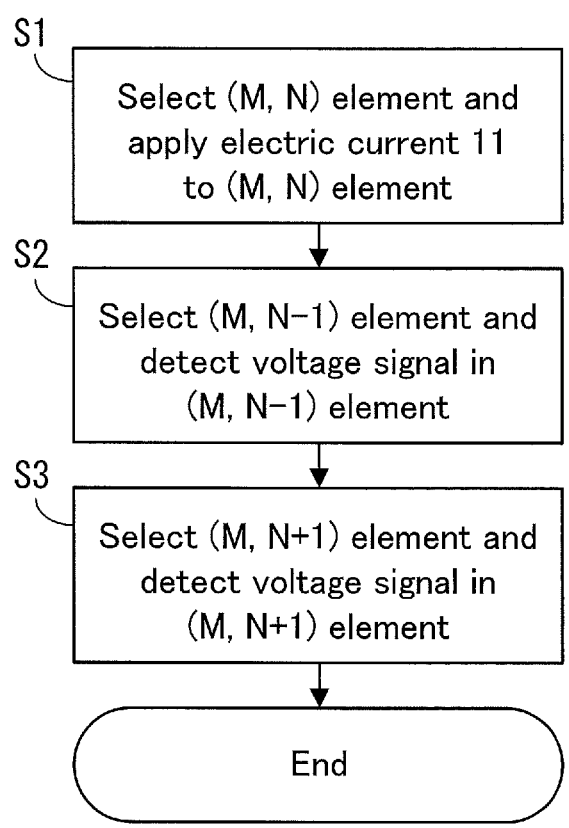
FIG. 10 is a flowchart corresponding to an example of a driving method of the spin device shown in FIG. 6.

As shown in FIG. 10, the spin injection source 6 ((M, N) element) located at (M, N) is selected, and the electric current 11 is applied to the element from the electric current source 8 connected to the element (S1). As a result, the flow of spins reflecting the spin polarization of the first ferromagnetic electrode 2 of the (M, N) element spreads in the plane of the graphene 1, thereby forming the spin accumulation region 12.

Next, the spin detecting portion 7 ((M, N−1) element) located at (M, N−1) is selected, and spin accumulation information of the portion of the graphene 1 at which the (M, N−1) element is disposed is detected as a voltage signal via the third ferromagnetic electrode 3 and the fourth electrode 5 of the (M, N−1) element by the voltage detector 9 connected to the element (S2). The voltage signal is, for example, a magnetoresistance signal which depends on the state of the spin polarization (magnetization state) of the first ferromagnetic electrode 2 of the (M, N) element and the state of the spin polarization (magnetization state) of the third ferromagnetic electrode 3 of the (M, N−1) element.

Next, the spin detecting portion 7 ((M, N+1) element) located at (M, N+1) is selected, and spin accumulation information of the portion of the graphene 1 at which the (M, N+1) element is disposed is detected as a voltage signal via the third ferromagnetic electrode 3 and the fourth electrode 5 of the (M, N+1) element by the voltage detector 9 connected to the element (S3). The voltage signal is, for example, a magnetoresistance signal which depends on the state of the spin polarization (magnetization state) of the first ferromagnetic electrode 2 of the (M, N) element and the state of the spin polarization (magnetization state) of the third ferromagnetic electrode 3 of the (M, N+1) element.

For example, when the magnetization state of the third ferromagnetic electrode 3 of the (M, N−1) element or the (M, N+1) element is the same as the magnetization state of the first ferromagnetic electrode 2 of the (M, N) element, the magnetoresistance signal of the (M, N−1) element or the (M, N+1) element detected by the voltage detector 9 is a zero signal.

For example, when the magnetization state of the third ferromagnetic electrode 3 of the (M, N−1) element or the (M, N+1) element is different from the magnetization state of the first ferromagnetic electrode 2 of the (M, N) element, a finite signal which is the magnetoresistance signal of the (M, N−1) element or the (M, N+1) element is detected by the voltage detector 9.

The spin accumulation information of the portion of the graphene 1 at which the (M, N−1) element is disposed, and the spin accumulation information of the portion at which the (M, N+1) element is disposed, may be sequentially or collectively detected by the voltage-signal detecting portion.

An example of a driving method of the spin device shown in FIG. 8 will be described with reference to FIG. 11. Also in the spin device shown in FIG. 8, the lattice points of the graphene 1 having a net shape can be represented in matrix such as (M, N), as similarly in the spin device shown in FIG. 6.

Figure 11:
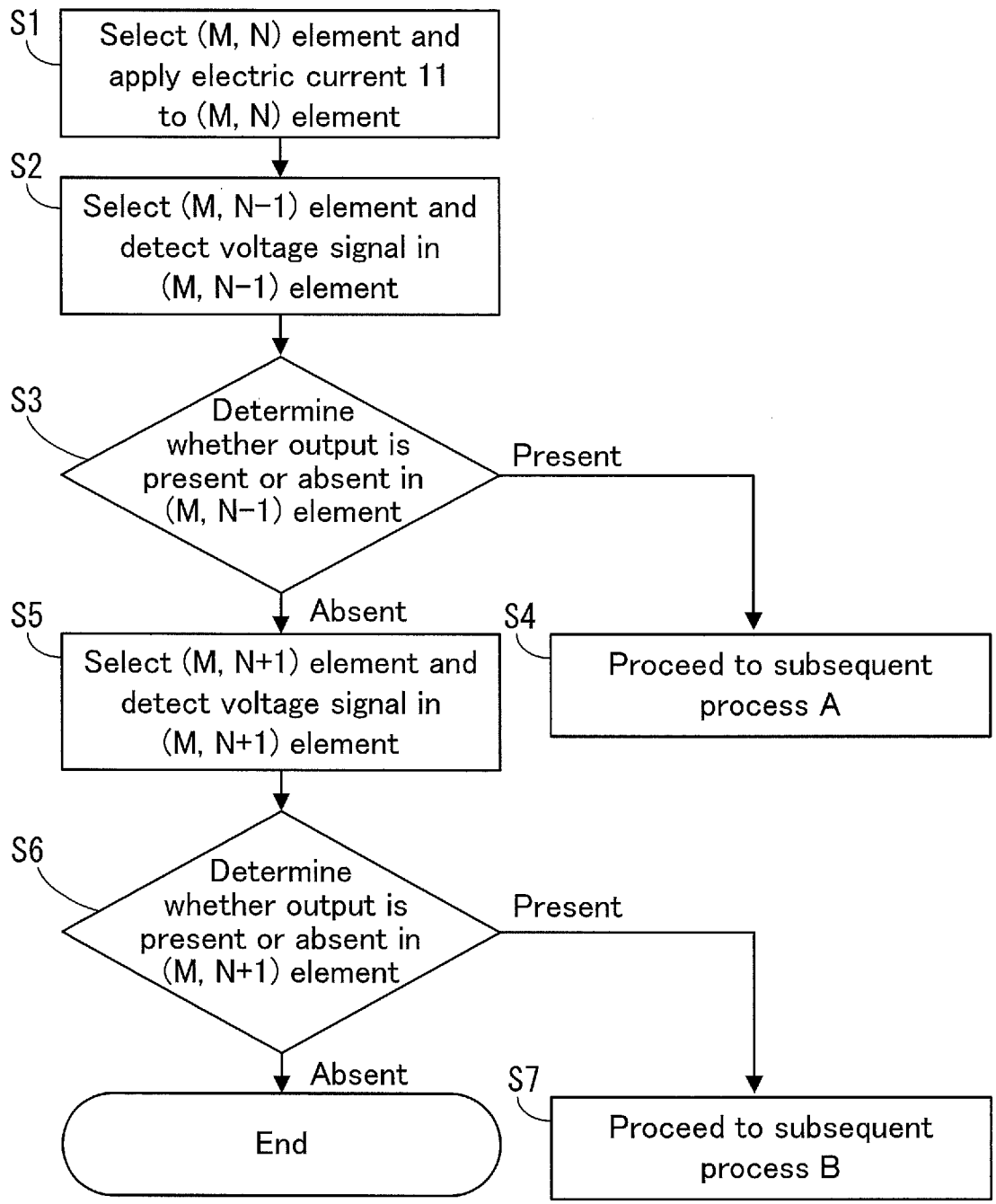
FIG. 11 is a flowchart corresponding to an example of a driving method of the spin device shown in FIG. 8.

As shown in FIG. 11, the spin injection source 6 ((M, N) element) located at (M, N) is selected, and the electric current 11 is applied to the element from the electric current source 8 connected to the element (S1). As a result, the flow of spins reflecting the spin polarization of the first ferromagnetic electrode 2 of the (M, N) element spreads in the plane of the graphene 1, thereby forming the spin accumulation region 12.

Next, the spin detecting portion 7 ((M, N−1) element) located at (M, N−1) is selected, and spin accumulation information of the portion of the graphene 1 at which the (M, N−1) element is disposed is detected as a voltage signal via the third ferromagnetic electrode 3 and the fourth electrode 5 of the (M, N−1) element by the voltage detector 9 connected to the element (S2). The voltage signal is, for example, a magnetoresistance signal which depends on the state of the spin polarization (magnetization state) of the first ferromagnetic electrode 2 of the (M, N) element and the state of the spin polarization (magnetization state) of the third ferromagnetic electrode 3 of the (M, N−1) element.

Next, whether a voltage output in the (M, N−1) element is a zero output or a finite output, that is, whether an output in the (M, N−1) element is present or absent is determined (S3). When the magnetization state of the third ferromagnetic electrode 3 of the (M, N−1) element is the same as the magnetization state of the first ferromagnetic electrode 2 of the (M, N) element, the magnetoresistance signal of the (M, N−1) element detected by the voltage detector 9 is a zero signal. When the magnetization states of both of the ferromagnetic electrodes are different from each other, a finite signal which is the magnetoresistance signal of the (M, N−1) element is detected by the voltage detector 9. The zero signal need not represent zero exactly. A threshold value usable for determining whether an output is present or absent may be set between the zero signal and the finite signal. In this case, the zero signal is a signal representing a voltage value larger than or equal to absolute zero and smaller than the threshold value. The finite signal is a signal representing a voltage value larger than the threshold value.

In the example shown in FIG. 11, when a finite signal of the (M, N−1) element is detected (when the output of the element is present) at S3, the operation is switched to a subsequent optional process (process A) (S4).

On the other hand, when a zero signal of the (M, N−1) element is detected (when an output of the element is absent) at S3, the spin detecting portion 7 ((M, N+1) element) located at (M, N+1) is selected, and spin accumulation information of the portion of the graphene 1 at which the (M, N+1) element is disposed is detected as a voltage signal via the third ferromagnetic electrode 3 and the fourth electrode 5 of the (M, N+1) element by the voltage detector 9 connected to the element (S5). The voltage signal is, for example, a magnetoresistance signal which depends on the state of the spin polarization (magnetization state) of the first ferromagnetic electrode 2 of the (M, N) element and the state of the spin polarization (magnetization state) of the third ferromagnetic electrode 3 of the (M, N+1) element.

Next, whether a voltage output in the (M, N+1) element is a zero output or a finite output, that is, whether an output in the (M, N+1) element is present or absent is determined (S6). When the magnetization state of the third ferromagnetic electrode 3 of the (M, N+1) element is the same as the magnetization state of the first ferromagnetic electrode 2 of the (M, N) element, the magnetoresistance signal of the (M, N+1) element detected by the voltage detector 9 is a zero signal. When the magnetization states of both of the ferromagnetic electrodes are different from each other, a finite signal which is the magnetoresistance signal of the (M, N+1) element is detected by the voltage detector 9.

In the example shown in FIG. 11, when a finite signal of the (M, N+1) element is detected (when an output of the element is present) at S6, the operation is switched to a subsequent optional process (process B) (S7). When a zero signal is detected (when an output of the element is absent), the operation is ended. That is, the operation of the spin device shown in FIG. 11 allows realization of switching among three processes, the process A, the process B, and the end of operation. In the example shown in FIG. 11, by using at least one spin detecting portion 7, spin accumulation information of the part of the graphene 1 at which the spin detecting portion 7 is disposed is detected as a voltage signal, and subsequent signal processes are switched in accordance with the detected voltage signal.

Figure 12:
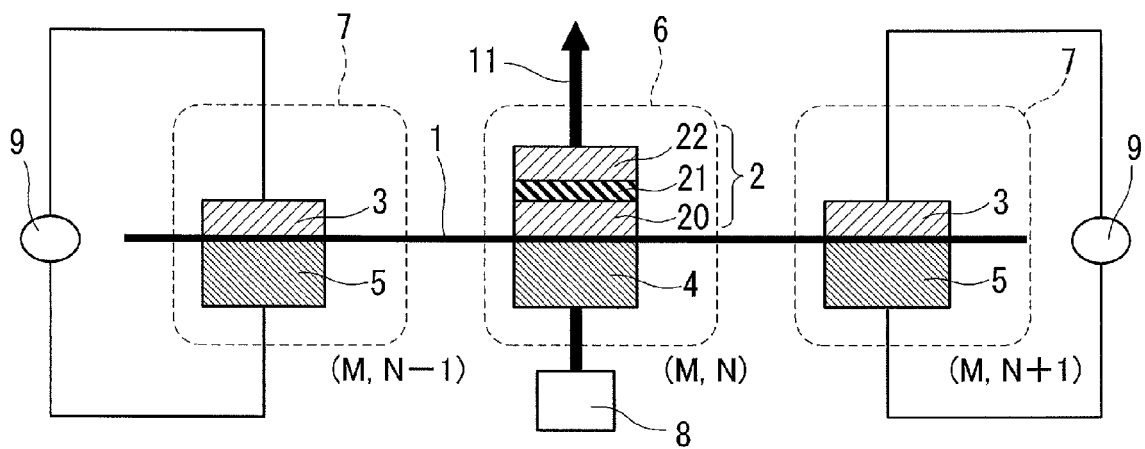
FIG. 12 is a diagram schematically showing another example than the above of a spin device of the present disclosure.

Another example of a spin device of the present disclosure is shown in FIG. 12. In the example shown in FIG. 12, the first ferromagnetic electrode 2 which is a component of the spin injection source 6 has a giant magnetoresistive (GMR) structure or a tunnel magnetoresistive (TMR) structure composed of a layered structure of a ferromagnetic layer 20, a non-magnetic layer 21, and a ferromagnetic layer 22. In the case of the TMR structure, the non-magnetic layer is a tunnel insulating layer, and the first ferromagnetic electrode has the tunnel insulating layer and the ferromagnetic layers. The other configurations are the same as those of the spin devices shown in FIGS. 6 and 9. In the example shown in FIG. 12, the magnetization state of the ferromagnetic layer 20 located on the graphene 1 side can be inverted by a spin torque in accordance with the direction of the application of the electric current 11.

Spin torque is reported in detail in Journal of Magnetism and Magnetic Materials, vol. 310, pp 169-175 (2007). Specifically, spin torque effect is a phenomenon in which, when the intensity of magnetization of the ferromagnetic layer 20, whose magnetization state is intended to be inverted in accordance with the direction of the application of the electric current, is smaller than the intensity of magnetization of the ferromagnetic layer 22 on the other side for sandwiching the non-magnetic layer 21 in cooperation with the ferromagnetic layer 20, the magnetization state of the ferromagnetic layer 20 is switched in accordance with the direction of the application of the electric current passing through the layered structure.

An example of a driving method of the spin device shown in FIG. 12 will be described with reference to FIG. 13.

Figure 13:
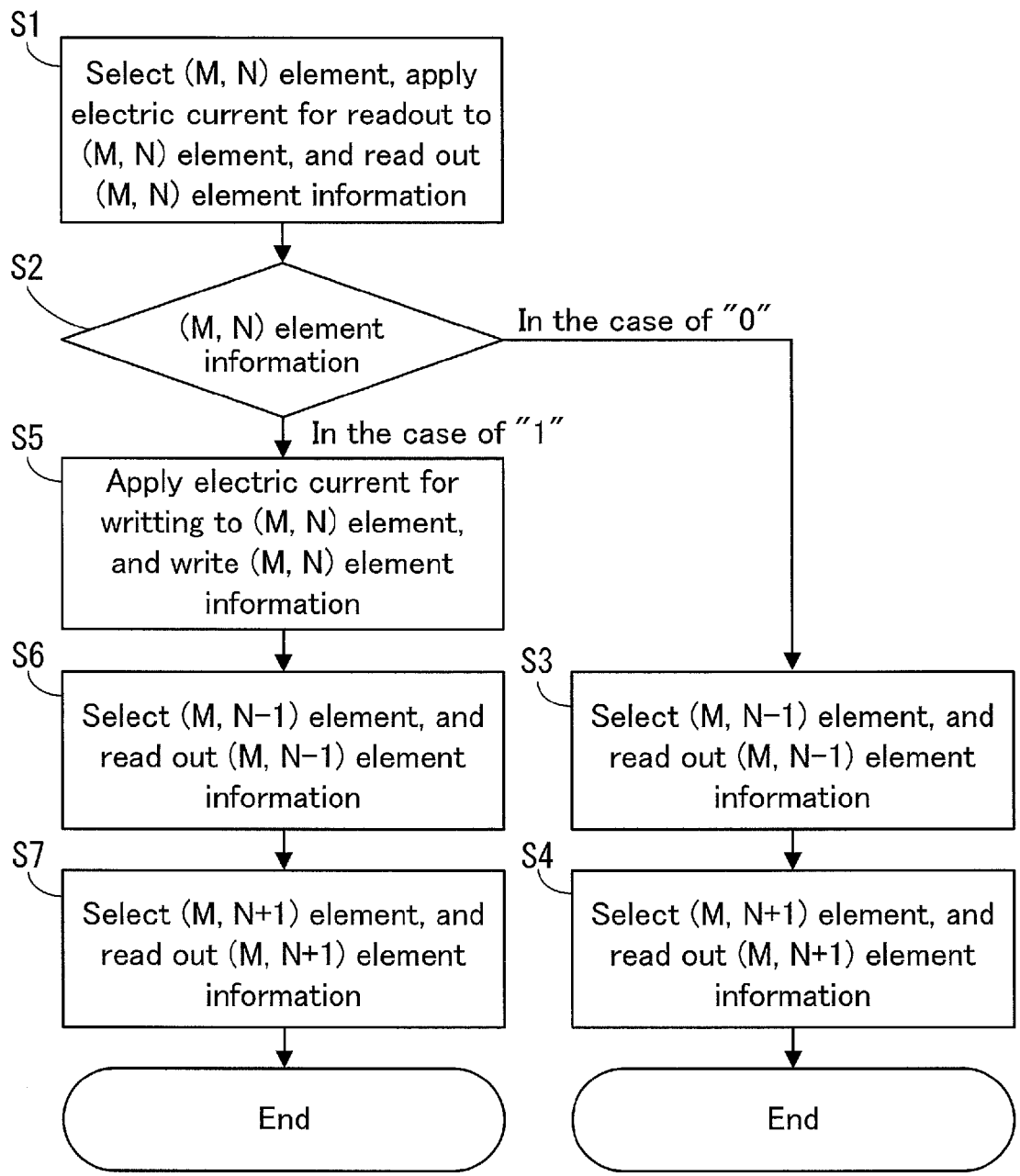
FIG. 13 is a flowchart corresponding to an example of a driving method of the spin device shown in FIG. 12.

As shown in FIG. 13, the spin injection source 6 ((M, N) element) located at (M, N) is selected, an electric current for readout is applied to the element, and thus information on the magnetization state of the ferromagnetic layer 20 which is in contact with the graphene 1 is read out as a voltage signal by utilizing the magnetoresistance effect of the GMR structure or the TMR structure composed of the layered structure of the ferromagnetic layer 20, the non-magnetic layer 21, and the ferromagnetic layer 22 (readout of (M, N) element information; Si).

Next, determination is made for the read-out (M, N) element information (S2). Here, it is assumed that a zero signal is obtained at S1 when the magnetization state of the ferromagnetic layer 20 is "up", and a finite signal (1, for example) is obtained at S1 when the magnetization state of the ferromagnetic layer 20 is "down".

When the (M, N) element information read out at S1 is zero, the spin detecting portion 7 ((M, N−1) element) located at (M, N−1) is then selected, and spin accumulation information of the portion of the graphene 1 at which the (M, N−1) element is disposed is detected as a voltage signal via the third ferromagnetic electrode 3 and the fourth electrode 5 of the (M, N−1) element by the voltage detector 9 connected to the element (S3). When the magnetization state of the third ferromagnetic electrode 3 of the (M, N−1) element is "up", a zero signal is obtained, whereas when the magnetization state is "down", a finite signal is obtained. That is, at S3, information on the magnetization state of the third ferromagnetic electrode 3 of the element is obtained as (M, N−1) element information.

Subsequently, the spin detecting portion 7 ((M, N+1) element) located at (M, N+1) is selected, and spin accumulation information of the portion of the graphene 1 at which the (M, N+1) element is disposed is detected as a voltage signal via the third ferromagnetic electrode 3 and the fourth electrode 5 of the (M, N+1) element by the voltage detector 9 connected to the element (S4). When the magnetization state of the third ferromagnetic electrode 3 of the (M, N+1) element is "up", a zero signal is obtained, whereas when the magnetization state is "down", a finite signal is obtained. That is, at S4, information on the magnetization state of the third ferromagnetic electrode 3 of the element is obtained as (M, N+1) element information.

In the example shown in FIG. 13, when the (M, N) element information obtained at S2 is 1, the magnetization state of the ferromagnetic layer 20 is inverted to "down" by the spin torque described above (S5). In other words, the (M, N) element information is written by applying an electric current for writing (switching current) to the (M, N) element at S5.

Next, the (M, N−1) element is selected, and spin accumulation information of the portion of the graphene 1 at which the (M, N−1) element is disposed is detected as a voltage signal via the third ferromagnetic electrode 3 and the fourth electrode 5 of the (M, N−1) element by the voltage detector 9 connected to the element (S6). When the magnetization state of the third ferromagnetic electrode 3 of the (M, N−1) element is "down", a zero signal is obtained, whereas when the magnetization state is "up", a finite signal is obtained. That is, at S6, information on the magnetization state of the third ferromagnetic electrode 3 of the element is obtained as the (M, N−1) element information.

Subsequently, the (M, N+1) element is selected, and spin accumulation information of the portion of the graphene 1 at which the (M, N+1) element is disposed is detected as a voltage signal via the third ferromagnetic electrode 3 and the fourth electrode 5 of the (M, N+1) element by the voltage detector 9 connected to the element (S7). When the magnetization state of the third ferromagnetic electrode 3 of the (M, N+1) element is "down", a zero signal is obtained, whereas when the magnetization state is "up", a finite signal is obtained. That is, at S7, information on the magnetization state of the third ferromagnetic electrode 3 of the element is obtained as the (M, N+1) element information.

In this way, the spin device shown in FIG. 12 can carry out readout operation while performing switching operation in accordance with rewriting of the magnetization state of the ferromagnetic layer 20 of the (M, N) element. The above description has been given of the case where two elements, the (M, N−1) element and the (M, N+1) element, are used as the spin detecting portions 7. However, similar operations may be sequentially or collectively performed for three or more spin detecting portions.

Figure 14:
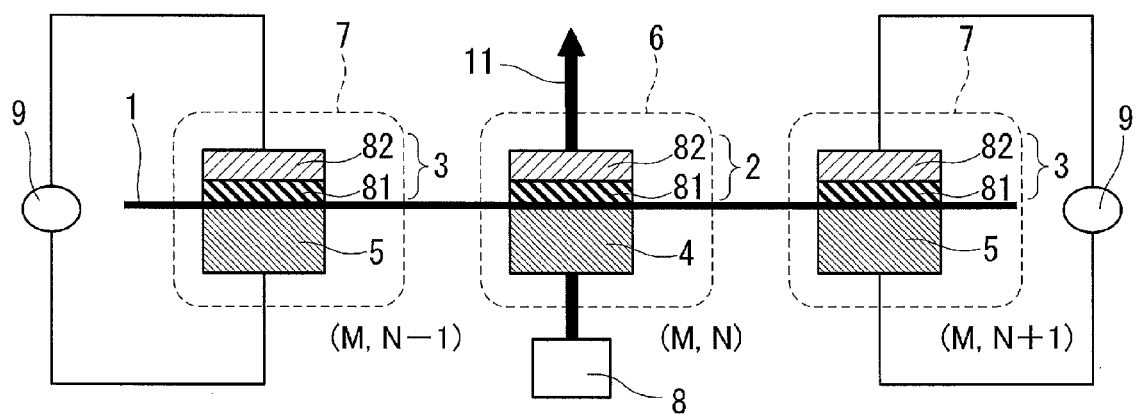
FIG. 14 is a diagram schematically showing another example than the above of a spin device of the present disclosure.

"The state where a ferromagnetic electrode is in electrical contact with the graphene 1" includes a state where a ferromagnetic electrode, for example, the first ferromagnetic electrode 2, has a tunnel insulating layer and a ferromagnetic layer, and the tunnel insulating layer is in contact with the graphene 1. That is, the ferromagnetic electrode may be in electrical contact with the graphene 1 via the tunnel insulating layer. An example of such a spin device is shown in FIG. 14. In the example shown in FIG. 14, the first ferromagnetic electrode 2 and the third ferromagnetic electrode 3 each have a tunnel insulating layer 81 and a ferromagnetic layer 82, and each tunnel insulating layer 81 is in contact with the graphene 1. The other configurations of the example shown in FIG. 14 are the same as those of the example shown in FIG. 9.

The efficiency $P_N$ of spin injection is represented by the following expression: $P_N = P_F/[1+(1-P_F^2)\cdot(R_N/R_F)]$. $P_F$ is a spin polarization ratio of a ferromagnetic material serving as a spin injection electrode, $R_F$ is a resistance of the ferromagnetic electrode, and $R_N$ is a resistance of graphene (OYO BUTURI (Applied Physics), vol. 77, pp. 255-263 (2008)). Accordingly, when the resistance of a non-magnetic material is much larger than the resistance of a ferromagnetic material, i.e., in the case of $R_N \gg R_F$, $P_N \ll P_F$ is satisfied, and therefore, the spin polarization of the ferromagnetic material serving as a spin injection electrode is remarkably reduced at the interface between the ferromagnetic material and the graphene. For this reason, there is a possibility that spins cannot be injected into the graphene sufficiently.

In contrast, it is expected that providing the tunnel insulating layer 81 between the ferromagnetic layer 82 and the graphene 1 will enhance the degree of consistency of the interfacial resistance between the ferromagnetic electrode and the graphene. Examples of the material of which the tunnel insulating layer 81 is made include aluminum oxide ($Al_2O_3$), magnesium oxide (MgO), boron nitride (BN), and spinel oxide ($MgAl_2O_4$).

Figure 15:
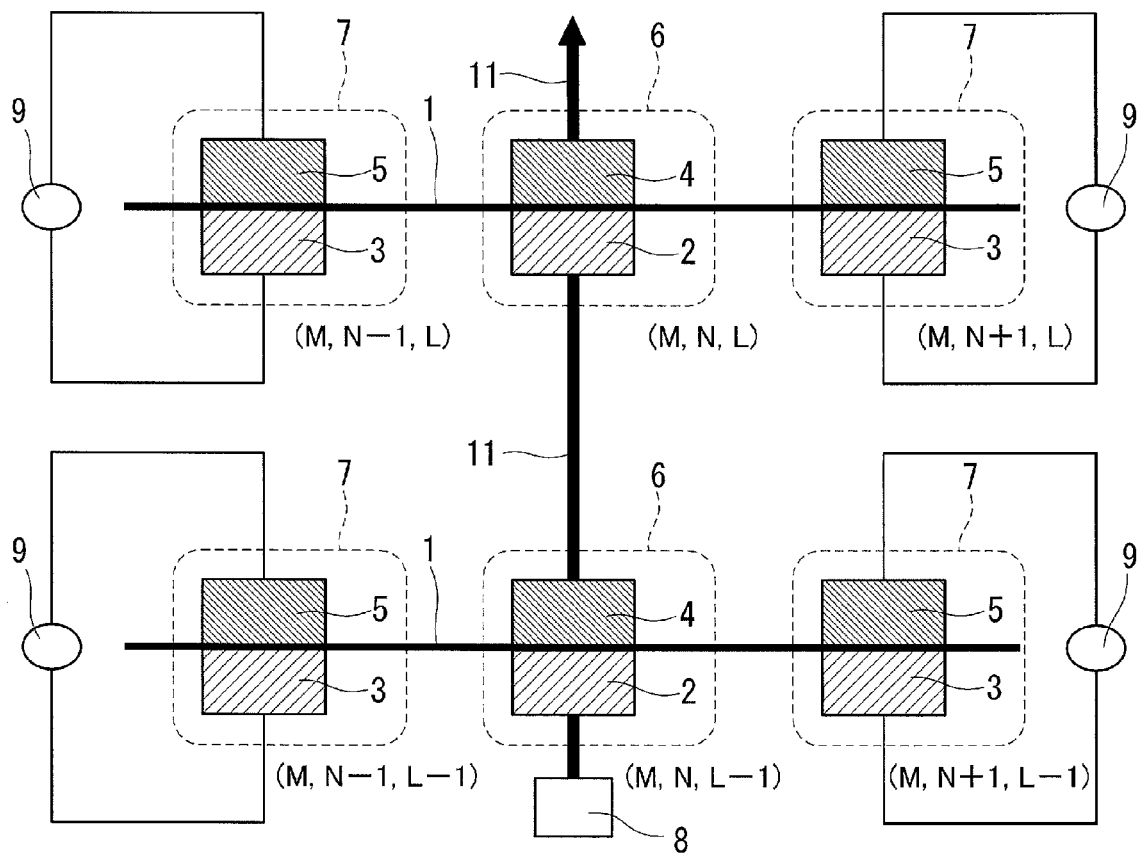
FIG. 15 is a diagram schematically showing another example than the above of a spin device of the present disclosure.

Another example of a spin device of the present disclosure is shown in FIG. 15. The example shown in FIG. 15 has a structure in which the spin devices shown in FIG. 8 are stacked vertically (in the thickness direction of the graphene 1). From another standpoint, the example shown in FIG. 15 has a structure in which two or more graphenes 1, on each of which the first ferromagnetic electrode 2, the second electrode 4, the third ferromagnetic electrode 3, and the fourth electrode 5 are disposed as described above, are stacked in their thickness direction.

In the spin device of FIG. 15, the electric current application for spin injection and the voltage signal detection for spin detection can be performed separately. For example, as shown in FIG. 15, the electric current 11 can be applied collectively to the spin injection sources 6 disposed on the different graphenes 1 (an L layer and an L−1 layer) by a single electric current source 8, instead of applying the electric current 11 individually to each of the spin injection sources 6 disposed on the L−1 layer and the L layer by switching the circuits and/or the electric current sources 8 of the current applying portion. In the example shown in FIG. 15, the electric current 11 is applied to the (M, N, L) element and the (M, N, L−1) element collectively. In this case, the current applying portion includes a circuit that applies the electric current 11 collectively to two or more pairs each composed of the first ferromagnetic electrode 2 and the second electrode 4 and disposed on the different graphenes. In addition, by the application of the electric current 11 passing through the two or more graphenes 1, signals corresponding to spin accumulation information can concurrently be outputted in two or more spin detecting portions 7 disposed on the different graphenes 1.

Figure 16:
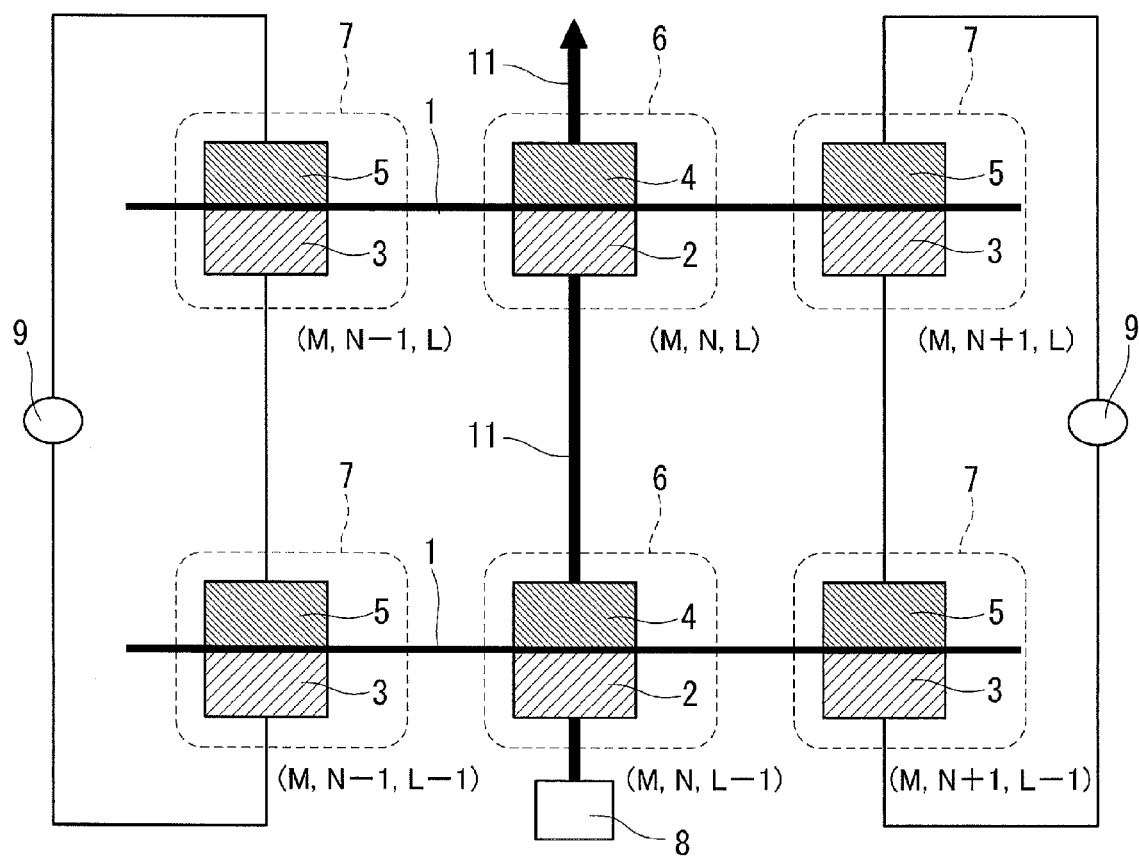
FIG. 16 is a diagram schematically showing another example than the above of a spin device of the present disclosure.

In the spin device of FIG. 15, the detections of voltage signals in the spin detecting portions 7 can individually be performed in each detection unit 7. In the example shown in FIG. 15, a corresponding voltage detector 9 is connected to each spin detecting portion 7. On the other hand, as shown in FIG. 16, voltage signals may collectively be detected in two or more spin detecting portions 7 arranged in the stacking direction of the graphenes 1. In this case, the configuration and operation of the voltage-signal detecting portion are simplified. In the example shown in FIG. 16, the voltage signals of the (M, N−1, L) element and the (M, N−1, L−1) element are collectively detected, while the voltage signals of the (M, N+1, L) element and the (M, N+1, L−1) element are collectively detected. In this case, the voltage-signal detecting portion includes a circuit that collectively detects, via two or more pairs each composed of the third ferromagnetic electrode 3 and the fourth electrode 5 and disposed on the different graphenes 1, spin accumulation information generated in the portions of each graphene 1 that are sandwiched by the pairs of the third ferromagnetic electrode 3 and the fourth electrode 5.

Figure 17:
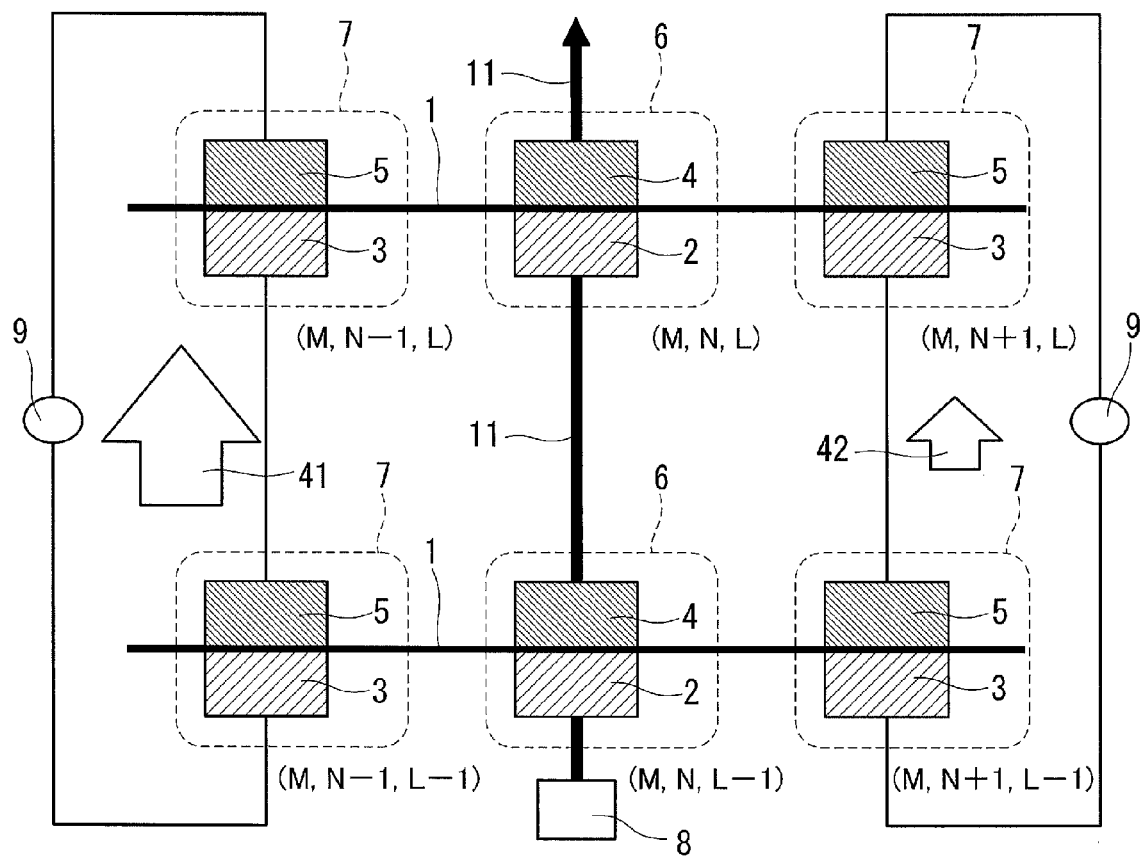
FIG. 17 is a diagram schematically showing an example of a magnetic sensor to which the spin device shown in FIG. 16 is applied.

When collective detection is carried out, the sum of signals in the stacking direction of the graphenes 1 is outputted. Accordingly, the sensitivity of the spin device can be further enhanced. FIG. 17 shows an example of a magnetic sensor to which the spin device shown in FIG. 16 is applied. With the magnetic sensor shown in FIG. 17, the distribution of spatially-modulated external magnetic fields, for example, the distribution of external magnetic fields 41 and 42 having different magnitudes, can be captured as modulation of spin currents in the planes of the graphenes 1. In this case, since the sum of signals of the spin detecting portions 7 in the stacking direction of the graphenes is obtained, a magnetic sensor of high sensitivity can be built.

Figure 18:
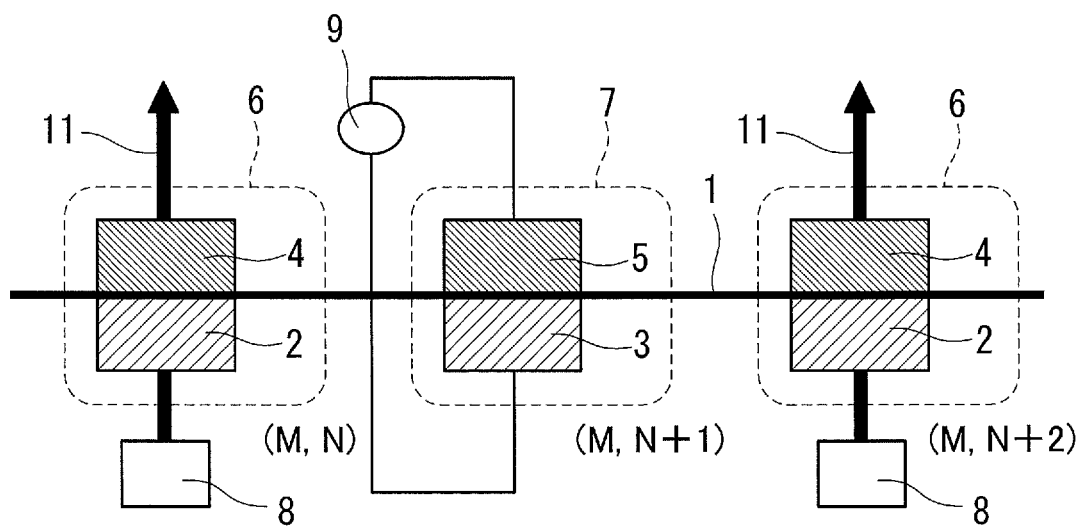
FIG. 18 is a diagram schematically showing another example than the above of a spin device of the present disclosure.

FIG. 9 shows elements located in the column M and row N−1, in the column M and row N, and in the column M and row N+1. FIG. 18 shows an example where an element located in the column M and row N+2 ((M, N+2) element) is further included. The element in the column M and row N+2 ((M, N+2) element) is the spin injection source 6. The (M, N+1) element which is the spin detecting portion 7 is disposed between two spin injection sources 6. In this case, when the electric currents 11 are applied from the electric current sources 8 to the (M, N) element and the (M, N+2) element, the state sum (OR logic) of the magnetization state of the first ferromagnetic electrode 2 of the (M, N) element and the magnetization state of the first ferromagnetic electrode 2 of the (M, N+2) element can be obtained as an output in the (M, N+1) element located between the two elements.

The ferromagnetic material of which the ferromagnetic electrodes are made is, for example, a metallic magnetic material, an oxide magnetic material, or a composite material thereof. The metallic magnetic material is, for example, Co, a Co—Fe alloy, a Ni—Fe alloy, or a Ni—Fe—Co alloy. In particular, Co or a Co—Fe alloy is desirable since large spin accumulation to be generated in the plane of a graphene. A Co-rich alloy is desirable as the Co—Fe alloy. As the metallic magnetic material, XMnSb (X is at least one element selected from Ni, Pt, Pb, and Cu) can also be employed. XMnSb has a high magnetic polarizability, and thus allows large spin accumulation to be generated in the plane of a graphene. The oxide magnetic material is, for example, $MFe_2O_4$ (M is one or more elements selected from Fe, Co, and Ni). $MFe_2O_4$ displays ferromagnetism even at relatively high temperature.

Co-rich alloys and Ni-rich alloys have higher resistance than Fe-rich alloys. Co-rich alloys have large magnetic anisotropy. A ferromagnetic material having desired properties can be obtained by combining these alloys and adjusting the composition ratio.

A magnetic film having perpendicular magnetization can be employed as a ferromagnetic material. Usual metallic magnetic films have large shape anisotropy, and the magnetization state thereof is likely to be affected by the shape of the films. If a perpendicularly-magnetized film is employed for a ferromagnetic electrode, the degree of freedom in the shape of the ferromagnetic electrode is increased. The type of the perpendicularly-magnetized film is not limited as long as perpendicular magnetization is displayed. Examples of the perpendicularly-magnetized film include artificial lattice films such as Pd/Co and Pt/Co, Tb—Fe—Co films, Sm—Co films, and Fe—Pt films.

The thickness of the ferromagnetic electrode is, for example, 1 nm or more and 100 nm or less. When the thickness is 10 nm or less, an electrode can further be stacked on the ferromagnetic electrode. The size of the ferromagnetic electrode in the in-plane direction is not limited as long as ferromagnetic property is maintained. By employing the graphene 1 whose lattice points of a net shape have enlarged areas as shown in FIG. 8, the size of the ferromagnetic electrode in the in-plane direction can easily be secured.

The material of which the non-magnetic electrode is made, and the material of which the wires and vias of the circuits are made, are materials that have a resistivity of 1 mΩ·cm or less, for example. The materials are, for example, Cu, Al, Cr/Au, TiN, TaN, TiW, or W, or materials containing two or more of these substances as main components.

Figure 19A:
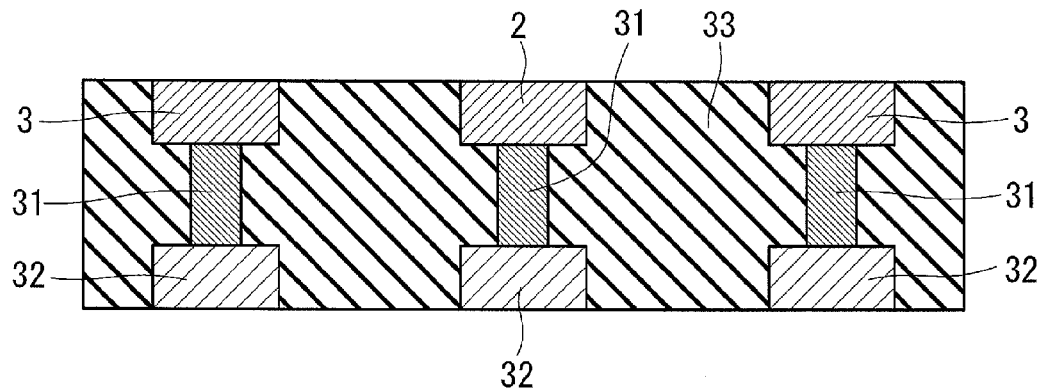
FIG. 19A is a cross-sectional view schematically showing an example of a production method of a spin device of the present disclosure.
Figure 19B:
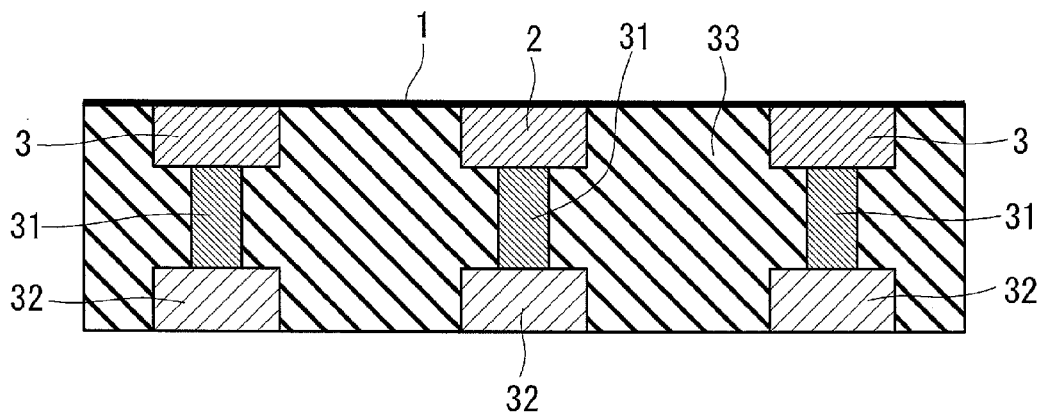
FIG. 19B is a cross-sectional view schematically showing an example of a production method of a spin device of the present disclosure.
Figure 19C:
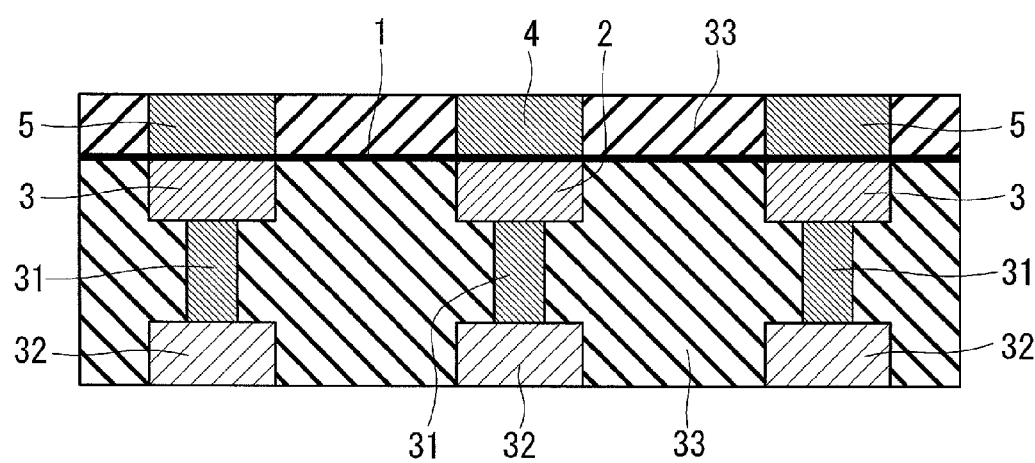
FIG. 19C is a cross-sectional view schematically showing an example of a production method of a spin device of the present disclosure.

An example of a production method of a spin device of the present disclosure is shown in FIG. 19A to FIG. 19C.

As shown in FIG. 19A, a first ferromagnetic electrode 2 and third ferromagnetic electrodes 3 are embedded in an insulating layer 33 in such a manner as to be connected to wiring electrodes 32 disposed in advance, and are then processed so as to expose the electrodes 2 and 3 at the surface of the insulating layer 33. The first ferromagnetic electrode 2 and the third ferromagnetic electrodes 3 are spaced apart from each other. An insulating material commonly used for semiconductor process can be used as the material of which the insulating layer 33 is made. The insulating material is, for example, TEOS (ethyl silicate) mainly consisting of $SiO_2$. In the example shown in FIG. 19A, the wiring electrodes 32 are electrically connected to the first ferromagnetic electrode 2 and the third ferromagnetic electrodes 3 by vias 31.

Next, as shown in FIG. 19B, a graphene 1 is disposed on the first ferromagnetic electrode 2 and the third ferromagnetic electrodes 3 in electrical contact with these electrodes 2 and 3. The graphene 1 may be disposed after a tunnel insulating layer is disposed on the ferromagnetic electrodes. The graphene 1 can be formed by, for example, mechanical peeling from a graphite crystal. The graphene 1 can also be obtained by CVD (Chemical Vapor Deposition). Graphene that is grown by CVD on Ru or Cu has high crystallinity.

Next, as shown in FIG. 19C, an insulating layer 33 is deposited on the graphene 1, openings through which the graphene 1 is exposed are provided in the deposited insulating layer 33 at such positions as to face the first ferromagnetic electrode 2 and the third ferromagnetic electrodes 3, and then a second electrode 4 and fourth electrodes 5 are formed in the openings in such a manner that these electrodes 4 and 5 are in electrical contact with the graphene 1. Then, heat treatment is performed as necessary. For example, the heat treatment is conducted at 300 to 600° C. (typically at 400° C.) under an argon atmosphere containing 4 volume % of $H_2$. Such heat treatment improves the electrical conductivity of each electrode.

The method shown in FIG. 19 A to FIG. 19C can also be conducted by reversing the order of formation of the first ferromagnetic electrode 2 and the third ferromagnetic electrodes 3 and formation of the second electrode 4 and the fourth electrodes 5. That is, the graphene 1 may be disposed on the second electrode 4 and the fourth electrodes 5 disposed apart from each other, in such a manner as to be in electrical contact with both the electrodes 4 and 5, and the first ferromagnetic electrode 2 and the third ferromagnetic electrodes 3 which are in electrical contact with the graphene 1 may be formed on the graphene 1 in such a manner that the first ferromagnetic electrode 2 and the second electrode 4 sandwich the graphene 1, and that the third ferromagnetic electrodes 3 and the fourth electrodes 5 sandwich the graphene 1.

Figure 20A:
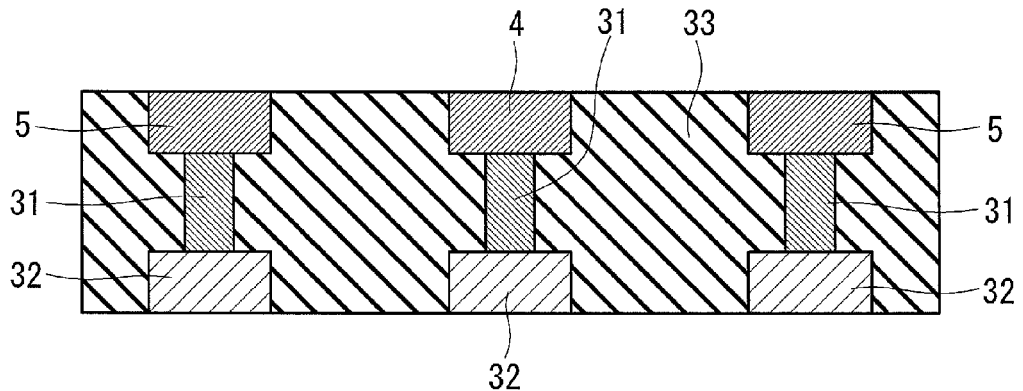
FIG. 20A is a cross-sectional view schematically showing an example of a production method of a spin device of the present disclosure.
Figure 20B:
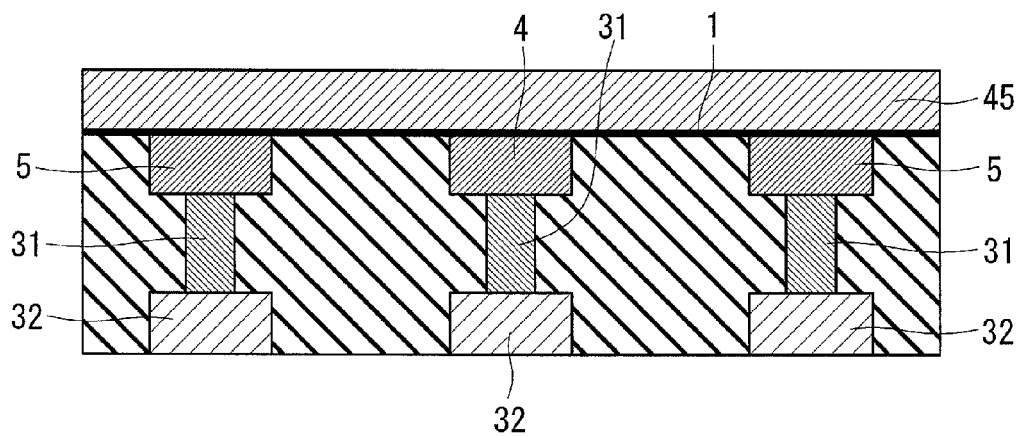
FIG. 20B is a cross-sectional view schematically showing an example of a production method of a spin device of the present disclosure.
Figure 20C:
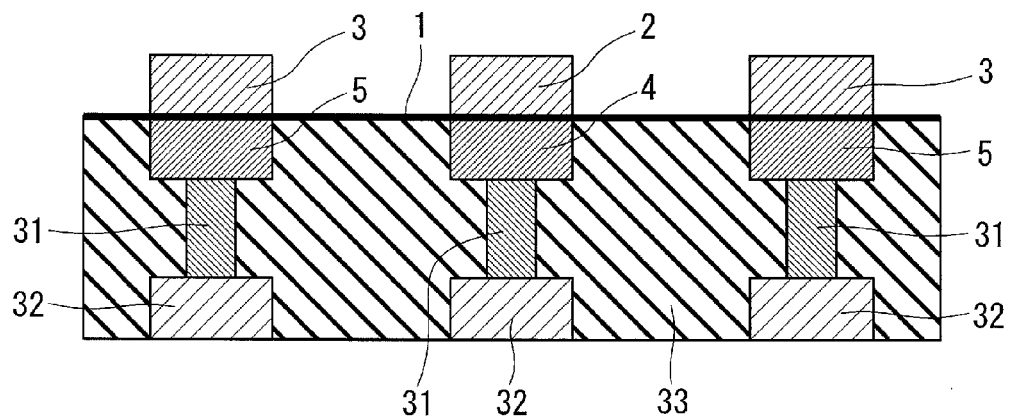
FIG. 20C is a cross-sectional view schematically showing an example of a production method of a spin device of the present disclosure.

An example of a production method of a spin device of the present disclosure is shown in FIG. 20A to FIG. 20C.

As shown in FIG. 20A, a second electrode 4 and fourth electrodes 5 are embedded in an insulating layer 33 in such a manner as to be connected to wiring electrodes 32 disposed in advance, and are then processed so as to expose the electrodes 4 and 5 at the surface of the insulating layer 33. The second electrode 4 and the fourth electrodes 5 are spaced apart from each other. In the example shown in FIG. 20A, the wiring electrodes 32 are electrically connected to the second electrode 4 and the fourth electrodes 5 by vias 31.

Next, as shown in FIG. 20B, a graphene 1 on one surface of which a ferromagnetic material layer 45 has been formed in advance is disposed on the second electrode 4 and the fourth electrodes 5 in such a manner that the graphene 1 is in electrical contact with these electrodes 4 and 5. The graphene 1 on which the ferromagnetic material layer has been formed in advance can be formed by, for example, CVD growth of graphene on a ferromagnetic material layer. Graphene grown by CVD on a Ni layer or a Co layer serving as the ferromagnetic material layer 45 has high crystallinity.

Next, as shown in FIG. 20C, microprocessing of the ferromagnetic material layer 45 is performed by partial etching or the like so that a first ferromagnetic electrode 2 is formed at such a position as to face the second electrode 4, and third ferromagnetic electrodes 3 are formed at such positions as to face the fourth electrodes 5. Then, heat treatment is performed as necessary. For example, the heat treatment is conducted at 300 to 600° C. (typically at 400° C.) under an argon atmosphere containing 4 volume % of $H_2$. Such heat treatment improves the electrical conductivity of each electrode. If hydrochloric acid (HCl) is used for etching of the ferromagnetic material layer 45, damage to the graphene at the time of etching can be reduced.

The method, in which the graphene 1 on one surface of which the ferromagnetic material layer 45 has been formed in advance is used, and microprocessing of the ferromagnetic material layer 45 is then performed to form the ferromagnetic electrodes, can be applied also to the case where the second electrode 4 and the fourth electrodes 5 are ferromagnetic electrodes made of ferromagnetic materials.

Figure 21:
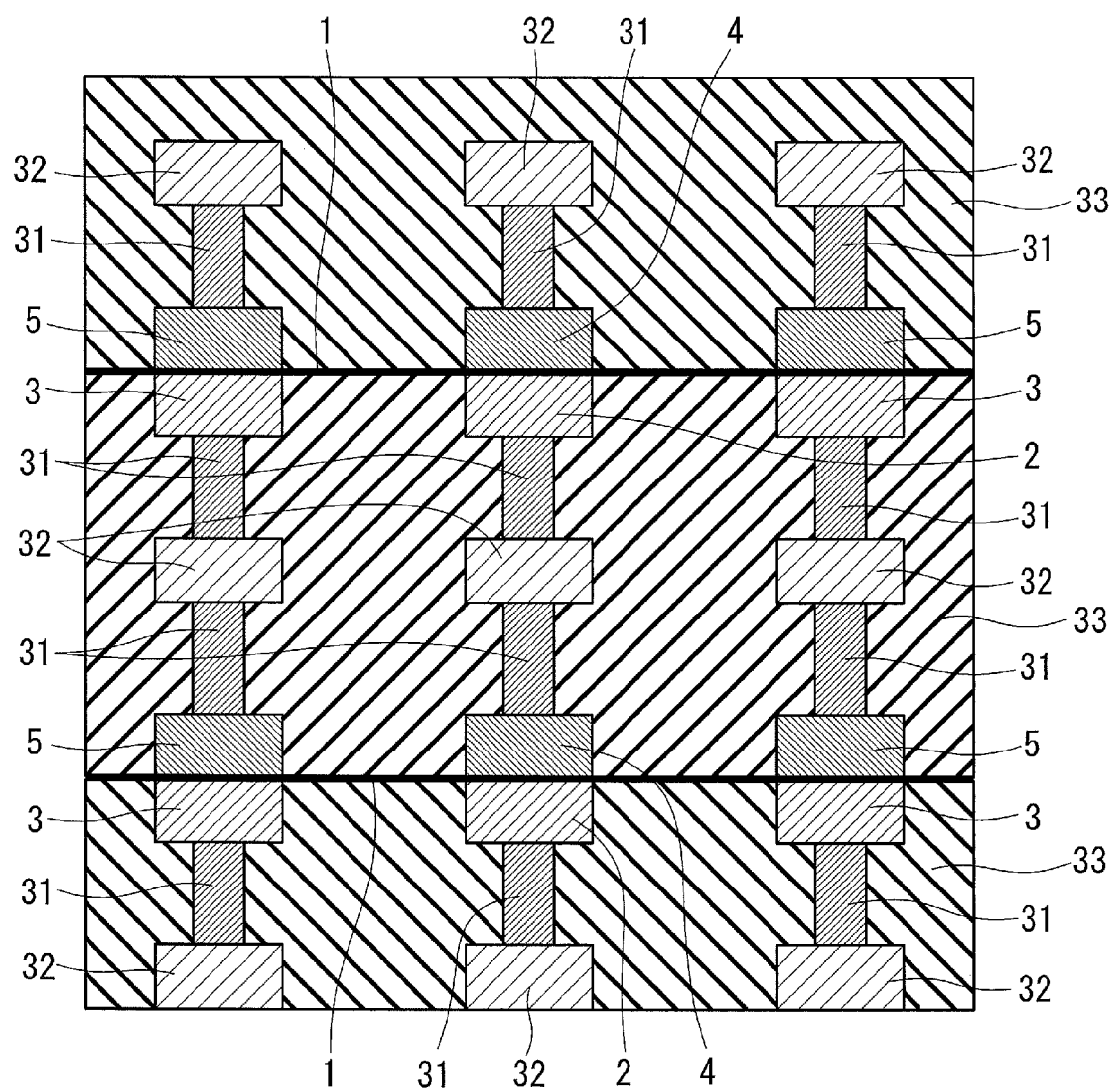
FIG. 21 is a cross-sectional view schematically showing another example than the above of a spin device of the present disclosure.

FIG. 21 shows an example of a spin device obtained by repeating the production method shown in FIGS. 19A to C or FIGS. 20A to C. Wiring electrodes 32 are electrically connected to first ferromagnetic electrodes 2 and third ferromagnetic electrodes 3 by vias 31. The first ferromagnetic electrodes 2 and the second electrodes 4 sandwich graphenes 1. The third ferromagnetic electrodes 3 and the fourth electrodes 5 sandwich the graphenes 1.

For example, the spin device shown in FIG. 15 or FIG. 16 can be realized by repeatedly forming the group of wiring electrode 32/via 31/first ferromagnetic electrode 2/graphene 1/second electrode 4/via 31/wiring electrode 32, and the group of wiring electrode 32/via 31/third ferromagnetic electrode 3/graphene 1/fourth electrode 5/via 31/wiring electrode 32, in the stacking direction of the graphenes 1.

These production methods of spin devices can realize not only basic embodiments of spin devices but also applied embodiments such as switches, non-volatile memories, and magnetic sensors.

The devices and methods of the present invention may be embodied in other forms without departing from the spirit or essential characteristics thereof. The embodiments disclosed in this specification are to be considered in all respects as illustrative and not limiting. The scope of the present invention is indicated by the appended claims rather than by the foregoing description, and all changes which come within the meaning and range of equivalency of the claims are intended to be embraced therein.

INDUSTRIAL APPLICABILITY

According to the present disclosure, the realization of the following devices can be expected: a device that uses spin currents which are not dissipated in principle as transfer carriers and thus has a significantly low power consumption; a device that requires no standby power due to the non-volatility of a ferromagnetic material; a device that transmits spin currents at a high efficiency; a device of low noise and high sensitivity; a device that uses graphene for a transfer channel and thus has a multi-layer structure which cannot be achieved in conventional semiconductor devices; and a device that can separate the conduction path of electric currents from the conduction path of spin currents and thus realizes high-sensitivity detection of spin currents.

These devices can be basic devices applicable to various types of electronic equipment.

What is claimed is:

1. A spin device comprising:
  a graphene;
  a first ferromagnetic electrode and a second electrode that are disposed in electrical contact with the graphene in such a manner as to sandwich the graphene;
  a third ferromagnetic electrode and a fourth electrode that are disposed apart from the first ferromagnetic electrode and the second electrode and in electrical contact with the graphene, in such a manner as to sandwich the graphene;

a current applying portion that applies an electric current between the first ferromagnetic electrode and the second electrode which sandwich the graphene; and a voltage-signal detecting portion that detects spin accumulation information as a voltage signal via the third ferromagnetic electrode and the fourth electrode, the spin accumulation information being generated, by application of the electric current, in a part of the graphene that is sandwiched between the third ferromagnetic electrode and the fourth electrode, wherein the first ferromagnetic electrode and the third ferromagnetic electrode are disposed on the same surface of the graphene, and the second electrode and the fourth electrode are non-magnetic electrodes or ferromagnetic electrodes.

2. The spin device according to claim 1, wherein the second electrode and the fourth electrode are non-magnetic electrodes.

3. The spin device according to claim 1, wherein the graphene has a net shape, as seen in a direction perpendicular to a principal plane of the graphene, the first ferromagnetic electrode and the second electrode are disposed at a lattice point of the net shape, and the third ferromagnetic electrode and the fourth electrode are disposed at each of two or more other lattice points present within a range of spin accumulation generated by application of the electric current between the first ferromagnetic electrode and the second electrode.

4. The spin device according to claim 1, having a structure including a stack of two or more graphenes on each of which the first ferromagnetic electrode, the second electrode, the third ferromagnetic electrode, and the fourth electrode are disposed, wherein the current applying portion includes a circuit that applies the electric current collectively to two or more pairs of the first ferromagnetic electrode and the second electrode, the pairs being disposed on the different graphenes of the stack.

5. The spin device according to claim 1, having a structure including a stack of two or more graphenes on each of which the first ferromagnetic electrode, the second electrode, the third ferromagnetic electrode, and the fourth electrode are disposed, wherein the voltage-signal detecting portion includes a circuit that collectively detects, via two or more pairs of the third ferromagnetic electrode and the fourth electrode, the spin accumulation information generated in parts of the graphenes, each of the parts being sandwiched by one of the pairs, the pairs being disposed on the different graphenes of the stack.

6. The spin device according to claim 1, wherein the first ferromagnetic electrode has a tunnel insulating layer and a ferromagnetic layer, and the tunnel insulating layer is in contact with the graphene.

7. The spin device according to claim 1, wherein the first ferromagnetic electrode has a giant magnetoresistive (GMR) structure.

8. The spin device according to claim 1, wherein the first ferromagnetic electrode has a tunnel magnetoresistive (TMR) structure.

9. A driving method of the spin device according to claim 1, the method comprising:

applying an electric current between the first ferromagnetic electrode and the second electrode which sandwich the graphene, by using the current applying portion; and detecting spin accumulation information as a voltage signal via the third ferromagnetic electrode and the fourth electrode, by using the voltage-signal detecting portion, the spin accumulation information being generated, by application of the electric current, in a part of the graphene that is sandwiched between the third ferromagnetic electrode and the fourth electrode.

10. The driving method according to claim 9, wherein two or more pairs of the third ferromagnetic electrode and the fourth electrode are disposed on the graphene, and the voltage-signal detecting portion sequentially or collectively detects the spin accumulation information generated, by application of the electric current, in parts of the graphene that are sandwiched by the two or more pairs.

11. The driving method according to claim 9, wherein two or more pairs of the third ferromagnetic electrode and the fourth electrode are disposed on the graphene, and the voltage-signal detecting portion detects, as the voltage signal, the spin accumulation information generated, by application of the electric current, in a part of the graphene that is sandwiched by at least one of the pairs, the method further comprising switching subsequent signal processes in accordance with the detected voltage signal.

12. A driving method of the spin device according to claim 1, wherein the first ferromagnetic electrode has a giant magnetoresistive (GMR) structure or a tunnel magnetoresistive (TMR) structure, and two or more pairs of the third ferromagnetic electrode and the fourth electrode are disposed on the graphene, the method comprising:

reading out a magnetization state of the first ferromagnetic electrode by magnetoresistance effect based on the GMR structure or the TMR structure;

maintaining the magnetization state of the first ferromagnetic electrode, or changing the magnetization state of the first ferromagnetic electrode by applying a switching current between the first ferromagnetic electrode and the second electrode, depending on the read magnetization state of the first ferromagnetic electrode;

applying an electric current between the first ferromagnetic electrode and the second electrode which sandwich the graphene, by using the current applying portion, and sequentially or collectively detecting spin accumulation information generated, by application of the electric current, in parts of the graphene that are sandwiched by the two or more pairs, by using the voltage-signal detecting portion.

13. A production method of the spin device according to claim 1, the method comprising:

disposing the graphene on the first ferromagnetic electrode and the third ferromagnetic electrode which are spaced apart from each other, in such a manner that the graphene is in electrical contact with both of the ferromagnetic electrodes; and forming, on the disposed graphene, the second electrode and the fourth electrode which are in electrical contact with the graphene, in such a manner that the second electrode and the first ferromagnetic electrode sandwich the graphene, and that the fourth electrode and the third ferromagnetic electrode sandwich the graphene.

14. The production method according to claim 13, wherein the second electrode and the fourth electrode are ferromagnetic electrodes, a ferromagnetic material layer is formed in advance on one surface of the graphene disposed on the first ferromagnetic electrode and the third ferromagnetic electrode, the one surface being opposite to the other surface facing the first ferromagnetic electrode and the third ferromagnetic electrode, and formation of the second electrode and the fourth electrode is performed by microprocessing of the ferromagnetic material layer.

15. A production method of the spin device according to claim 1, the method comprising:

disposing the graphene on the second electrode and the fourth electrode which are spaced apart from each other, in such a manner that the graphene is in electrical contact with both of the electrodes; and forming, on the disposed graphene, the first ferromagnetic electrode and the third ferromagnetic electrode which are in electrical contact with the graphene, in such a manner that the first ferromagnetic electrode the second electrode sandwich the graphene, and that the third ferromagnetic electrode and the fourth electrode sandwich the graphene.

16. The production method according to claim 15, wherein a ferromagnetic material layer is formed in advance on one surface of the graphene disposed on the second electrode and the fourth electrode, the one surface being opposite to the other surface facing the second electrode and the fourth electrode, and formation of the first ferromagnetic electrode and the third ferromagnetic electrode is performed by microprocessing of the ferromagnetic material layer.

* * * * *